(12) United States Patent
Hart et al.

(10) Patent No.: US 7,976,815 B2
(45) Date of Patent: Jul. 12, 2011

(54) SHAPE CONTROLLED GROWTH OF NANOSTRUCTURED FILMS AND OBJECTS

(75) Inventors: Anastasios John Hart, Somerville, MA (US); Alexander Henry Slocum, Bow, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 901 days.

(21) Appl. No.: 11/586,185

(22) Filed: Oct. 25, 2006

(65) Prior Publication Data

US 2007/0090489 A1 Apr. 26, 2007

Related U.S. Application Data

(60) Provisional application No. 60/729,882, filed on Oct. 25, 2005.

(51) Int. Cl.
*D01F 9/12* (2006.01)

(52) U.S. Cl. .................... 423/447.1; 423/447.3

(58) Field of Classification Search ........... 423/447.1, 423/447.3
See application file for complete search history.

(56) References Cited

U.S. PATENT DOCUMENTS

| 6,297,063 | B1 * | 10/2001 | Brown et al. ............... 438/2 |
| 6,803,260 | B2 | 10/2004 | Shin et al. |
| 7,160,531 | B1 * | 1/2007 | Jacques et al. ............ 423/447.3 |
| 2002/0150684 | A1 | 10/2002 | Jayatissa |
| 2003/0116503 | A1 | 6/2003 | Wang et al. |
| 2005/0112051 | A1 | 5/2005 | Liu et al. |
| 2005/0170089 | A1 | 8/2005 | Lashmore et al. |

* cited by examiner

*Primary Examiner* — Stuart Hendrickson
(74) *Attorney, Agent, or Firm* — Chapin IP Law, LLC

(57) ABSTRACT

A method and apparatus for growing nanostructures is presented. A growth substrate including at least one reaction site is provided as is a device disposed proximate the growth substrate. Energy is provided to the reaction site and a reaction species is introduced to the growth substrate. This results in a nanostructure growing from the reaction site wherein the growth process of the nanostructure is controlled by providing a force to the device.

29 Claims, 22 Drawing Sheets

SHAPE CONTROLLED GROWTH OF NANOSTRUCTURED FILMS AND OBJECTS

CROSS REFERENCE TO RELATED APPLICATIONS

The present application claims the benefit of U.S. Provisional Patent Application No. 60/729,882, filed on Oct. 25, 2005, which is incorporated herein by reference in its entirety.

BACKGROUND

The growth of films of nanostructures, such as carbon nanotubes, on substrates can be performed by a variety of methods. The methods include thermal Chemical Vapor Deposition (CVD) where a chemical precursor is converted into a desired material such as a thin film or a deposit of nanostructures. The deposition occurs on a substrate, and the substrate is typically energized (heated) to promote the deposition process. The precursor typically breaks down and a portion of the dissociated precursor binds to the substrate while the remainder leaves the site as waste product. A properly prepared substrate can be used to define the adsorption areas and thus control the locations of growth.

For example, to produce carbon nanotubes by CVD, an appropriate catalyst and precursor are chosen, and after the precursor surrounds the adsorption sites, a carbon nanotube "grows" from the catalyst particles on the substrate. There are numerous methods of producing CNTs by CVD; for example thermal CVD at atmospheric pressure, using a hydrocarbon gas (e.g. $C_2H_2$, $C_2H_4$, or $CH_4$) $_{and}$ a predeposited arrangement of catalyst nanoparticles. At a relatively high areal density of catalytic growth sites and a relatively high CNT growth rate, a vertically aligned (VA) growth mode is typical whereby the CNTs self-orient perpendicular to the substrate surface due to initial crowding and continue to grow upward in this direction.

Previously, non-contact methods have been used to guide the direction of CNT growth. For example, isolated single wall nanotubes (SWNTs) can be grown to millimeter or centimeter lengths when suspended by gas flow during growth, and application of an electric field during growth can exert a force on a nanotube and/or a catalyst particle, to achieve aligned and direction-controllable growth in plasma-enhanced CVD processes, and to achieve growth of aligned CNTs spanning gaps between microfabricated electrodes. Further, fluid flows and surface tension forces at fluid interfaces can direct post-growth assembly of CNTs into patterns and structures on surfaces.

SUMMARY

While the chemical kinetics of growing nanostructures catalytic chemical vapor deposition (CVD) have been studied widely. While many reaction variables including pressure, temperature, reactant composition and flow rate have been studied, mechanical forces have not been used to affect the nanostructure growth process.

Methods and devices are disclosed for controlling the growth and assembly of nanostructures, specifically films of nanostructures on substrates, using techniques which control the thickness and topography of the films. Typically, forces are applied, to cause the film of nanostructures to grow into a desired configuration. Furthermore, the force output by the growth of nanostructures may be used to cause assembly of two or more components, or as an actuation element, or as an interface material. For example, the nanostructures are films of carbon nanotubes grown from a catalyst material deposited on a substrate, and are used as a thermal or electrical interface material.

A particular embodiment of a method of performing shape-controlled growth of nanostructured objects includes providing a growth substrate including at least one reaction site and providing a device (e.g. a cap substrate) disposed proximate the growth substrate. The method further includes providing energy to (e.g. heating) the growth substrate and introducing a reaction species to the growth substrate. The method additionally includes growing a nanostructure from the reaction site and controlling the growth process of the nanostructure by providing a force to the cap substrate.

In another embodiment, an apparatus is provided for performing shape-controlled growth of nanostructured objects. The apparatus includes a closed container and a growth substrate including at least one reaction site disposed within the closed container. Also included is device (a cap substrate) disposed proximate the growth substrate and a heating apparatus for heating the reaction site. At least one aperture is provided in the closed container capable of use for introducing a reaction species to the growth substrate. A nanostructure is grown from the reaction site upon introduction of the reaction species to the reaction site. The growth process of the nanostructure is controlled by providing a force to the cap substrate.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1A:
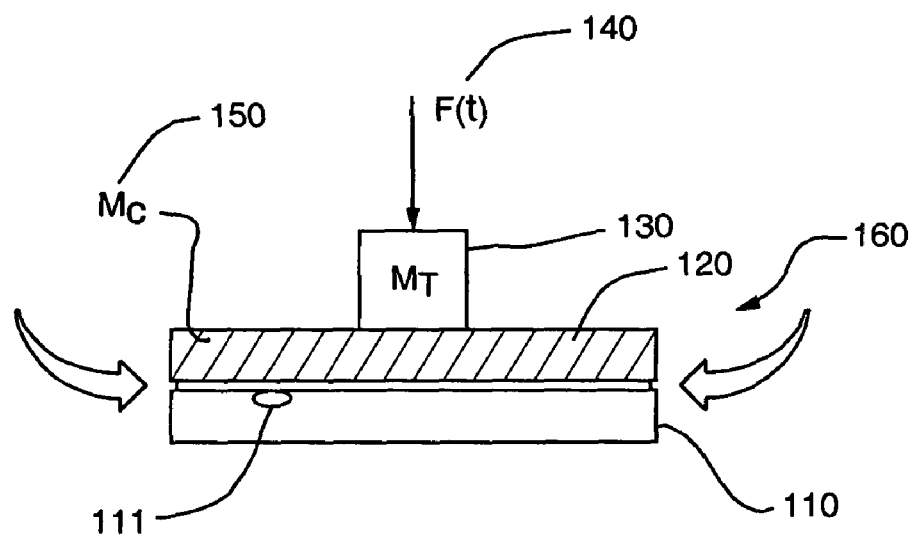
FIGS. 1A and 1B shows placement of a cap substrate on top of a substrate on which nanostructures grow, where a force is applied to the growth substrate and/or the growing nanostructures, by actuating the cap substrate.
Figure 1B:
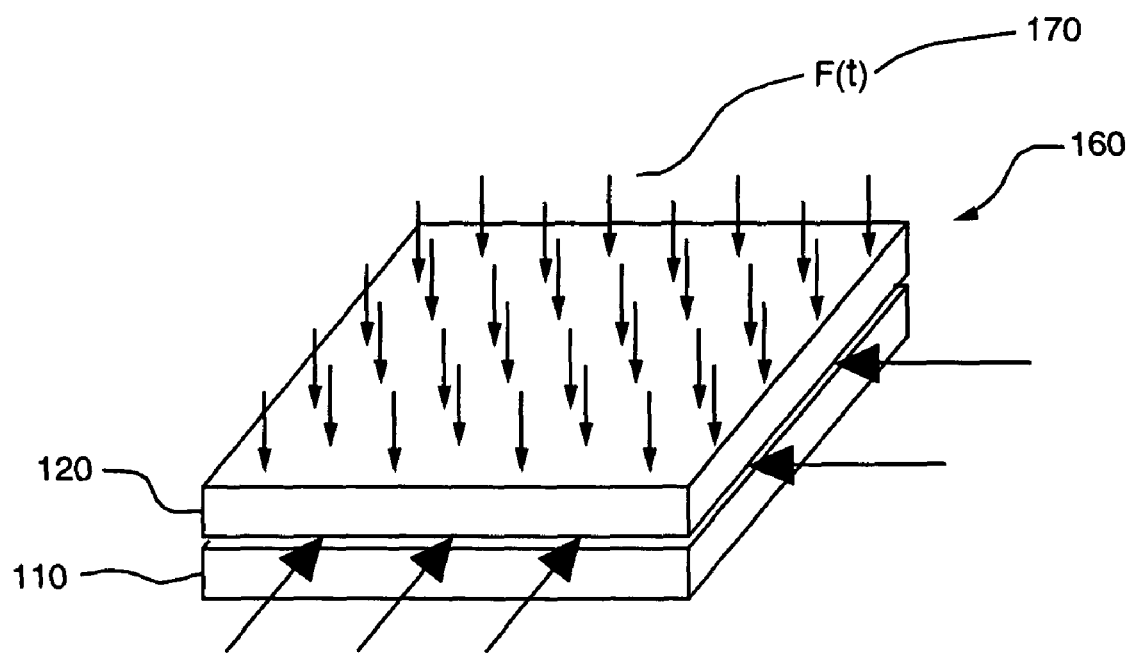

This invention controls the CVD growth of nanostructures by placing a cap substrate on top of the growth substrate, controlling the gas flow to the growth substrate, and controlling the force and/or forces applied to the growth substrate and/or the growing nanostructures, by contact with the cap substrate. FIGS. 1A and 1B show an exemplary setup of a growth substrate 110 coated with growth sites 111 (e.g. for carbon nanotube growth an arrangement of nanoparticles of catalyst transition metal such as Fe, Co, or Ni, optionally on a supporting layer such as $Al_2O_3$, MgO, or $SiO_2$), which is capped by a device 120 (also referred to as a secondary substrate or cap substrate). The mass 150 of the secondary substrate, a secondary mass 130 placed on top of the secondary substrate, and a time-dependent force 140, contribute to the force applied on the growth substrate 110, and therefore apply a force to the nanostructures which grow from the surface of the growth substrate. In perspective view, a spatially-controlled time-dependent force 170 is applied to the cap substrate. Note that as suggested in FIG. 1, the growth of nanostructures may lift the cap substrate, at a rate which depends on the force applied to the nanostructures during growth and the force capability of the growth reaction.

Figure 2A:
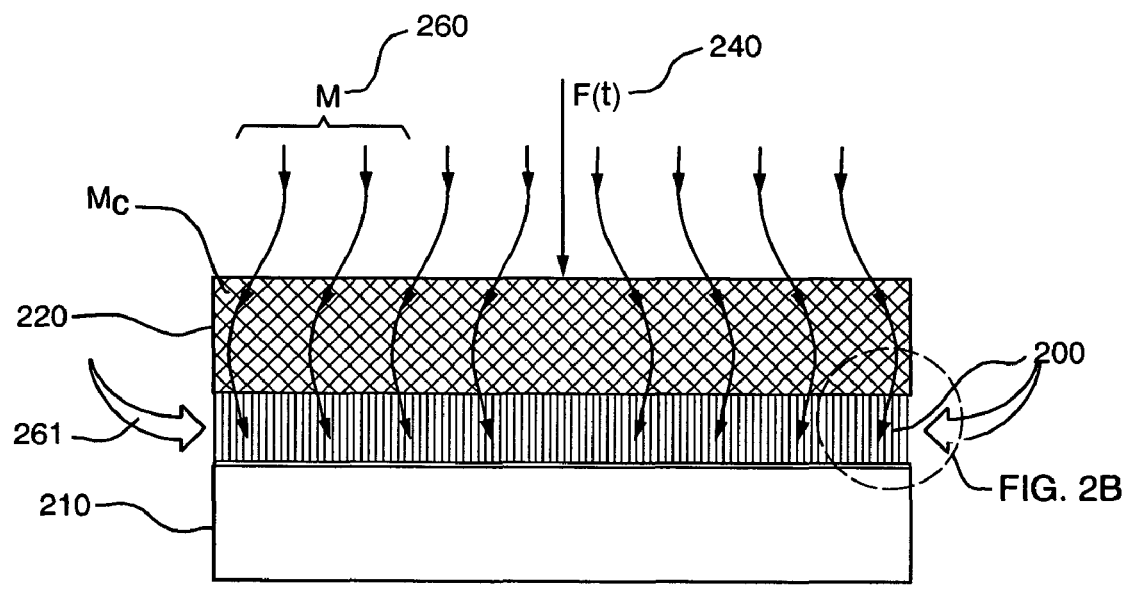
FIGS. 2A and 2B shows placement of a cap substrate on top of a substrate on which nanostructures grow, where the cap substrate contains holes, pores or microchannels.
Figure 2B:
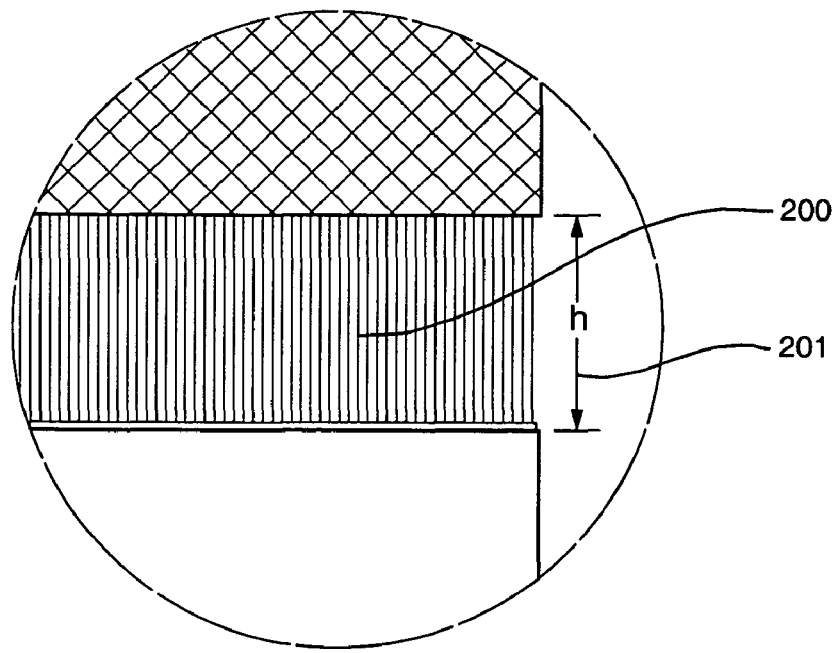

FIGS. 2A and 2B shows an alternative setup using two substrates, where growth substrate 210, coated with reaction sites (also referred to as growth sites), is placed under cap substrate 220, which contains pores, holes, or microchannels (collectively referred to as cavities) which permit a spatially uniform flow 260 to be directed through the cap substrate and to the growth sites, so as to cause growth of a uniform distribution of nanostructures from the growth substrate, such as the uniform film 200, with thickness h indicated 201. The time-dependent force 260 may also be applied to affect the growth of nanostructures from the growth substrate. The force may be applied by a number of methods, including using an electric or magnetic field to induce a body force on the cap substrate, by direct transmission to an actuator such as a motor or solenoid, or by application of a gas or fluid pressure to the top surface of the cap substrate, or by the weight of the cap substrate or a weight placed on top of the cap substrate.

Figure 3:
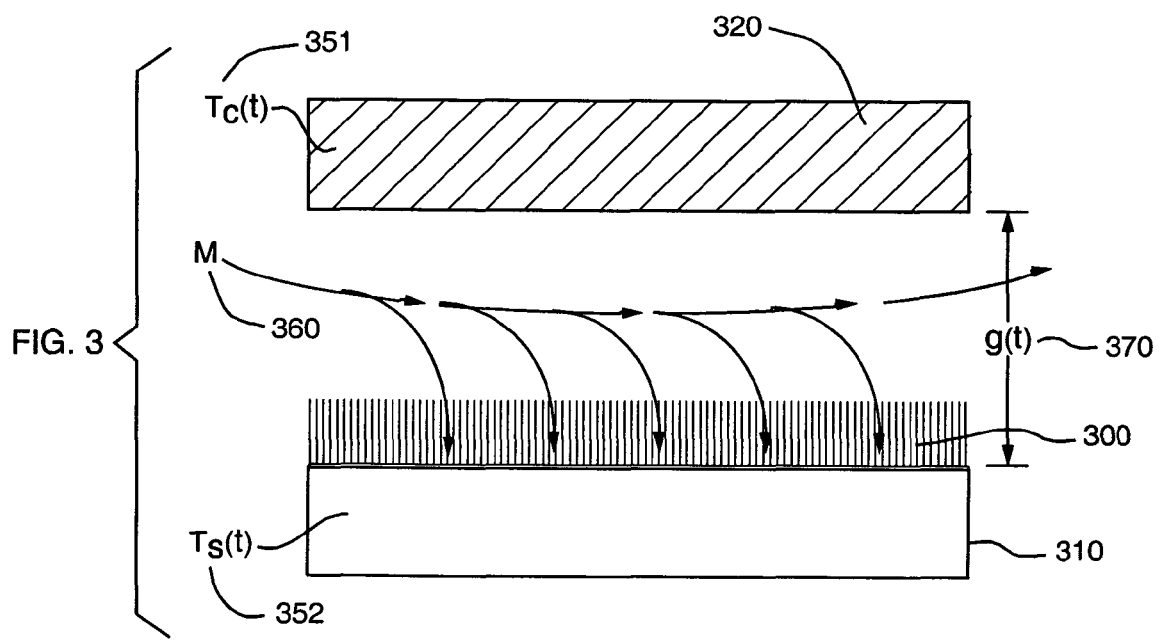
FIG. 3 shows placement of a cap substrate at a distance above a substrate on which nanostructures grow.

FIG. 3 shows an alternative embodiment, where the secondary substrate 320, here called a shield is spaced above the growth substrate 310, so as to allow the flow 360 to pass between the substrates, to enable growth of nanostructures 300 from the growth substrate. The temperatures 351 and 352 of the shield and growth substrates and/or of the growth sites may be controlled independently, such as by resistive heating of silicon or by radiative or inductive heating, and the temperature of the surrounding environment and the flow 360 may also be controlled such as by placing the substrates in flow-confining apparatus such as a sealed reaction tube. The spacing 370 between the substrates may also be controlled during operation of the apparatus.

Figure 4A:
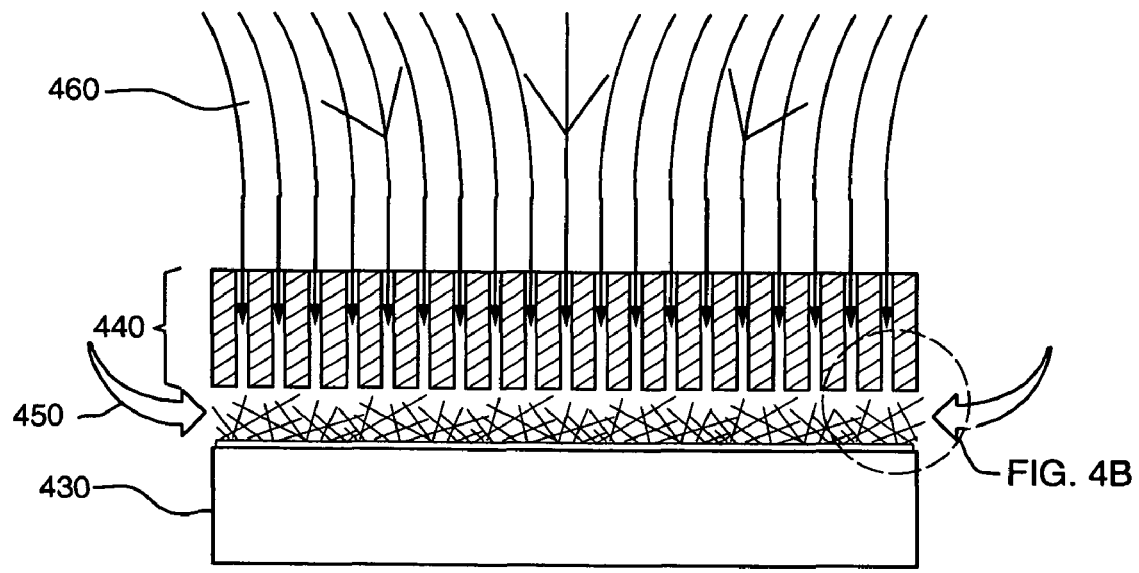
FIGS. 4A and 4B shows placement of a cap substrate on top of a substrate on which nanostructures grow, where the flow through the cap substrate is pre-treated by contact with suitable materials arranged on the surfaces of the cap.
Figure 4B:
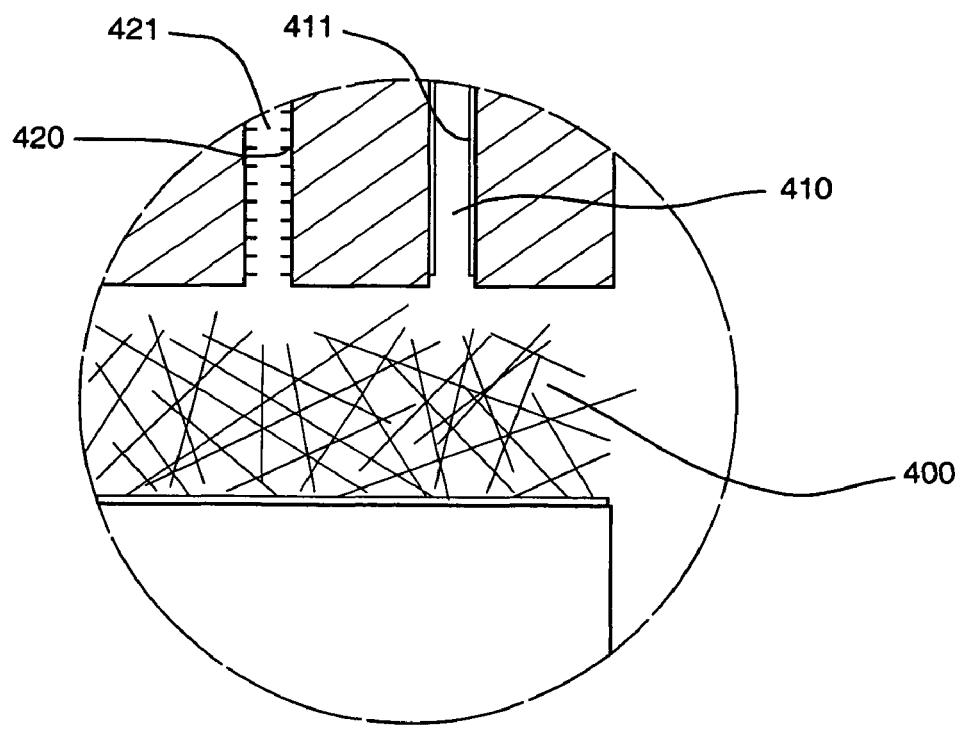

The embodiment of FIGS. 4A and 4B is similar to that of FIGS. 2A and 2B; however, growth substrate 44 is capped by substrate 440, and the surfaces of 440 are coated with materials (e.g. thin films 411 in microchannel 410, catalytic nanoparticles 421 in microchannel 420) which contribute to the thermal and/or catalytic pre-processing of flow 460 as it moves toward the growth substrate to contribute to growth of nanostructures 400. Note that the nanostructures may be tangled, aligned in a particular direction, or in any configuration imparted by the growth process, and may result from growth sites arranged on the substrate in any suitable fashion known to those skilled in the art. Flow 450, entering in the gap between the substrates, is also present; however, in a particular embodiment shown here it is intended that the magnitude of flow 460 far exceeds 450.

Figure 5:
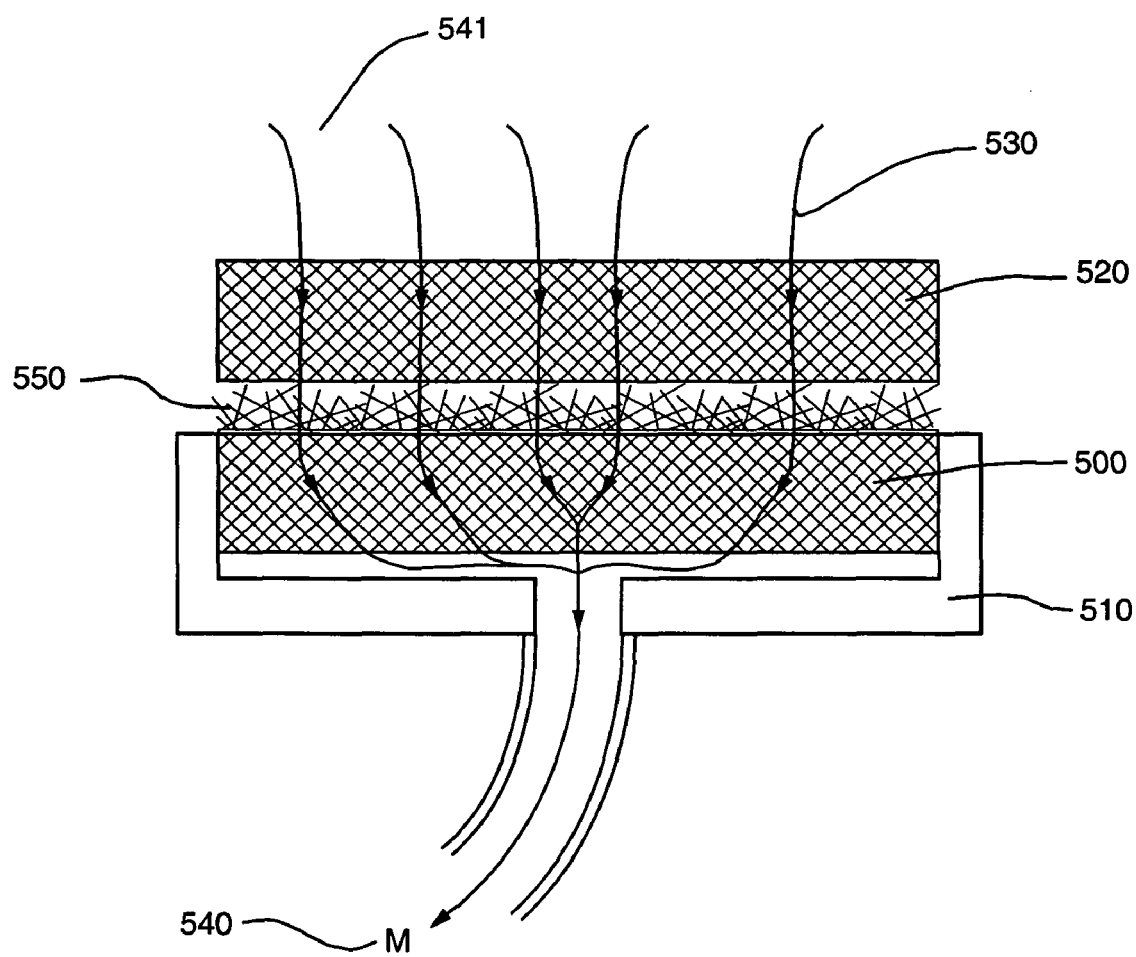
FIG. 5 shows placement of a cap substrate on top of a substrate on which nanostructures grow, where both the growth substrate and secondary substrate contain holes, pores, or microchannels which allow reactants to pass substantially perpendicular to the substrate surfaces.

FIG. 5 shows a yet additional embodiment of the dual substrate configuration, where growth substrate 500 and cap substrate 520 both contain holes, pores, or microchannels which allow flow 540 to pass primarily perpendicular to the main (largest area) substrate surfaces, and through nanostructures 550 which grow between the substrates. In this example, the flow is collected centrally from below the growth substrate as stream 540, using fixture 510.

Figure 6A:
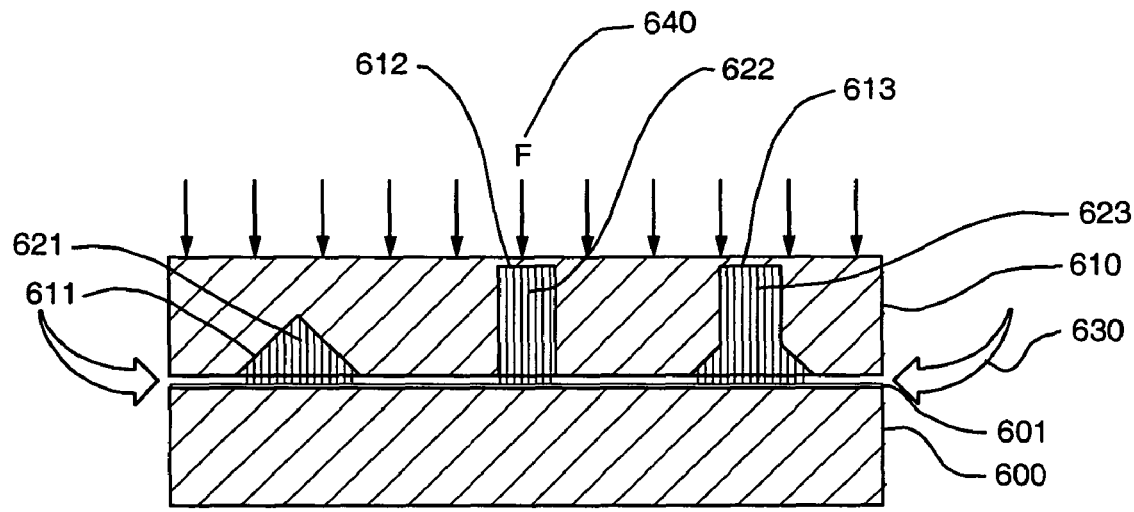
FIGS. 6A, 6B and 6C shows placement of a template cap substrate on top of a substrate on which nanostructures grow, where the cap is textured so that the nanostructures can grow to fill the cavities between the growth substrate and the cap substrate; free-standing forms of nanostructures on the growth substrate of after removal of the template; and free-standing forms of nanostructures after removal of the template and the growth substrate.
Figure 6B:
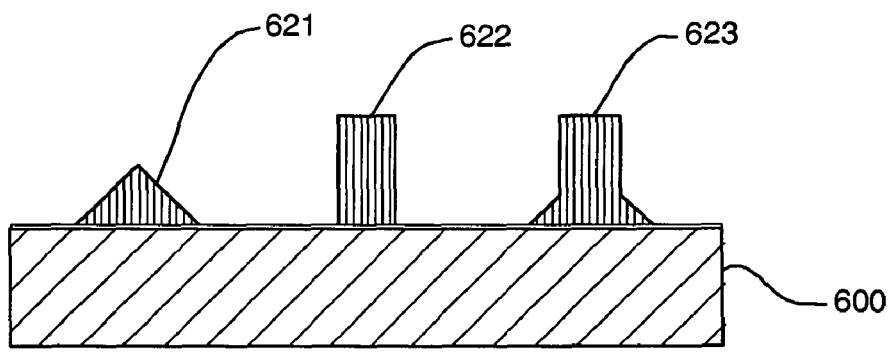
Figure 6C:
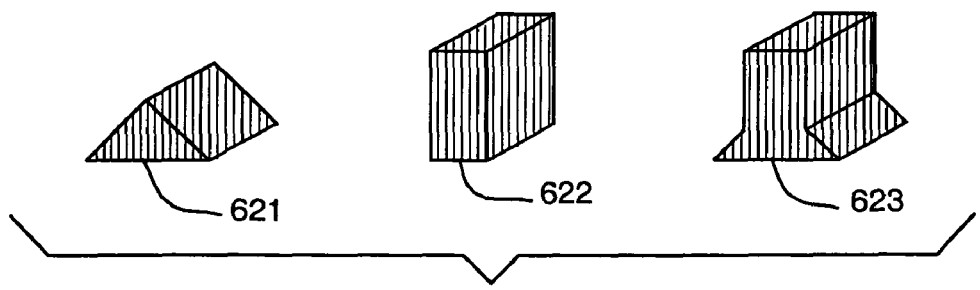

Further, the growth of nanostructured films may be directed by utilizing a cap substrate which has a manufactured topography (e.g., a template), such as a pattern of microchannels etched in silicon, to cause shape-controlled growth of nanostructures from the growth substrate. FIGS. 6A, 6B and 6C illustrate an exemplary method of shape-controlled growth, where growth substrate 600 is covered by an arrangement 601 of growth sites, and cap substrate 610 rests on the growth substrate. Nanostructures grow in the cavities between the growth substrate and the cap substrate, and the exemplary forms of nanostructures 621, 622, and 623, conform to the shape of the features etched in the cap substrate, as indicated by the contact between the nanostructures and surfaces 611, 612, and 613 of the template. Reactants for growth of nanostructures are provided by flow 630, which penetrates the interface between the substrates, and force 640 is applied to hold the cap substrate against the growth substrate. Following growth of nanostructures, the cap substrate may be removed to leave the forms of nanostructures on the growth substrate. Further, the forms of nanostructures may be removed from the growth substrate, using suitable mechanical, thermal, and/or chemical means to break the attachment between the nanostructures and the substrate, so the forms of nanostructures may be further processed, bonded to another substrate, or otherwise incorporated in other materials and/or devices.

An alternative embodiment uses a template cap, where the cap contains holes, pores, or microchannels, so as to enable delivery of a spatially-varying or spatially uniform gas flow over the area of the growth substrate. The growth substrate is covered by cap, and flows pass through the cap substrate and reach the growth sites, in addition to and preferably in far greater magnitude to flows which penetrate the interface between the substrates. As indicated here, the growth sites may be patterned in areas such as and on the growth substrate, or generally arranged in any suitable fashion. It is appreciated that application of a sufficient force to the growth sites retards growth from the growth sites, so the growth of nanostructures may be physically patterned by maintaining suitable contact between the mating areas of cap and the growth substrate during the growth process, while nanostructures grow to fill the cavities between the substrates, such as when growth sites are uniformly arranged on the growth substrate.

In any of these embodiments, the growth substrate and/or the cap substrate may be arbitrarily structured. For example, the growth substrate may be structured and the cap substrate may be flat, or the growth substrate and cap substrate may both be structured. Growth sites may be arranged on the growth substrate, and/or on the cap substrate, such that nanostructures grow between the substrates. Alternatively, growth sites may be delivered to the surfaces of the substrates using a gas-phase delivery process known to those skilled in the art, such as the process where iron is supplied from ferrocene, and the iron bonds to the substrate surfaces and forms iron particles which subsequently serve as sites for the growth of carbon nanotubes.

Figure 7:
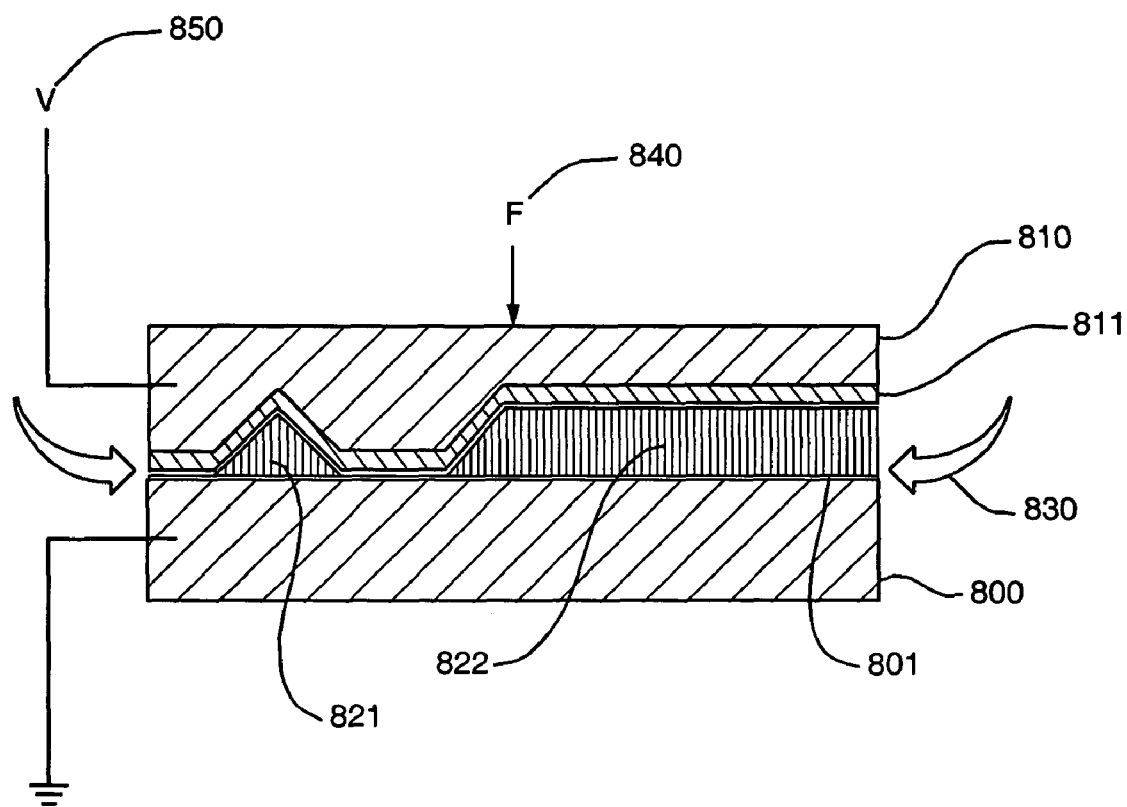
FIG. 7 is an exemplary apparatus for using an electric field to direct growth of nanostructures within cavities between a growth substrate and a microstructured cap template.

In addition to application of a mechanical force to the nanostructures, an electric field may be used to direct the growth of electrically conductive nanostructures to conform to the shape of a template. FIG. 7 illustrates such an exemplary method, where substrate 800, on which growth sites 801 are arranged, is capped by a template 810. The downward-facing surface of the template is coated by an insulating (dielectric) layer 811. The template and the growth substrate are conductive, and an electric field is applied as a voltage 850 between the substrates. The insulating layer prevents the nanostructures from shorting the field between the substrates, when the nanostructures contact the external surfaces of both substrates. Forms of nanostructures, for example 821 and 822, grow to take the shape of the cavities between the substrate, and force 840 is applied to the template.

Figure 8:
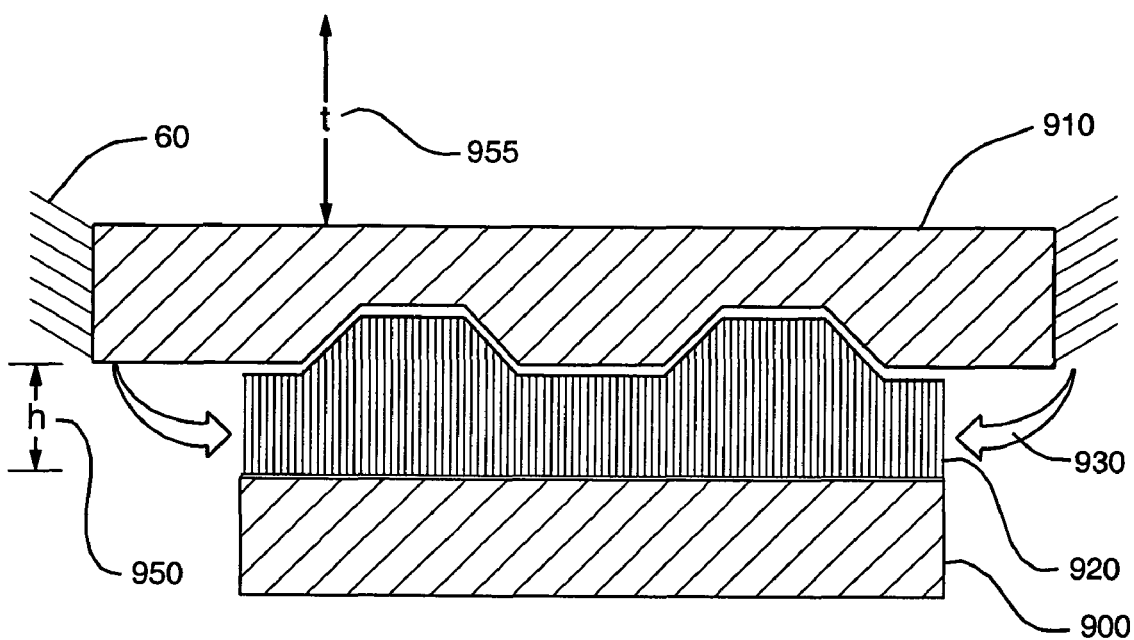
FIG. 8 shows placement of a shield substrate at a distance above a growth substrate, where nanostructures grow from the growth substrate to contact and conform to the texture of the shield substrate.

Furthermore, the template may be spaced above the growth substrate, so as to allow nanostructures to grow and fill the space between the substrates, as illustrated in FIG. 8. Here, growth substrate 900 is held beneath template substrate 910, and nanostructures 910 grow from the growth substrate toward the template substrate, and conform to the shape of the template substrate. The distance 950 between the substrates is controlled during growth, whereby one or both of the substrates are moved to control the distance between the substrates; for example, the template substrate is translated vertically as indicated by 955. Alternatively, the substrates are anchored during the growth process as suggested 960, or a force is applied to one or both of the substrates during the process of growing nanostructures. In this example, flow 930 causes the growth of nanostructures; however, in accordance with the other embodiments of the invention it is appreciated that the flow may be delivered by making one or both of the substrates permeable to flow, such as by fabricating the substrate from a porous material.

Figure 9A:
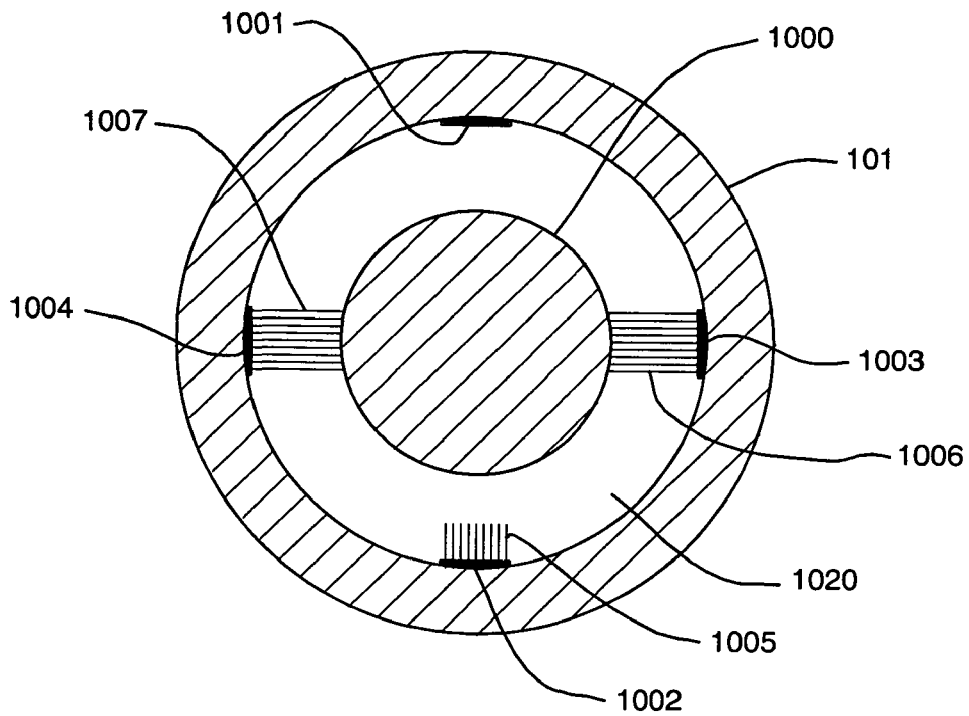
FIGS. 9A and 9B shows growth of nanostructures between a shaft and a concentric housing, depicting growth when the elements are held in place; and growth directed by relative motion between the elements.
Figure 9B:
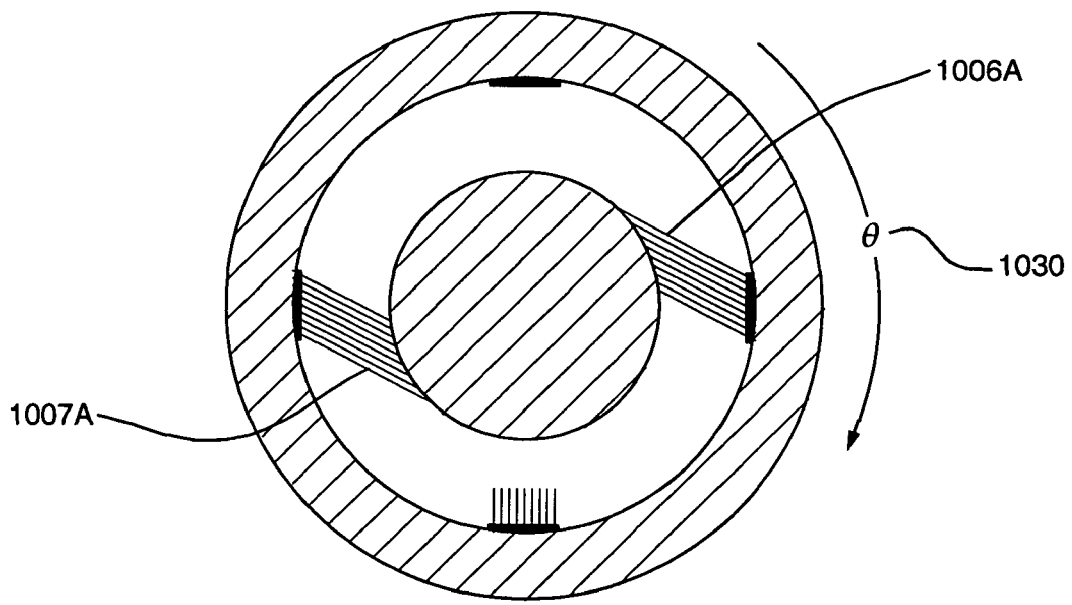

The embodiments of the invention can be extended to involve growth of nanostructures such as carbon nanotubes, to form a connection or interface between surfaces of any two or more distinct components. As a further example, FIGS. 9A and 9B illustrate growth of aligned nanostructures in the space between a circular shaft 1000 and a concentric housing 1010. Growth sites are distributed on the inner surface of the housing, as indicated by areas 1001, 1002, 1003, and 1004, and/or may be arranged on the outer surface of the shaft. A supply of reactants is introduced into the gap 1020 between the shaft and the housing, and causes growth of nanostructures from the growth sites, under suitable reaction conditions. Arrangements of nanostructures are shown at different stages of the growth process, such as 1005 which partially bridge the distance between the shaft and housing, and 1006 and 1007, which grow to contact the shaft. Relative motion may be used between the components to orient the nanostructures during the growth process, as suggested by the orientation of the nanostructures 1006A and 1007A, which is caused for example when the shaft is held stationary and the housing is rotated as suggested by 1030.

Figure 10A:
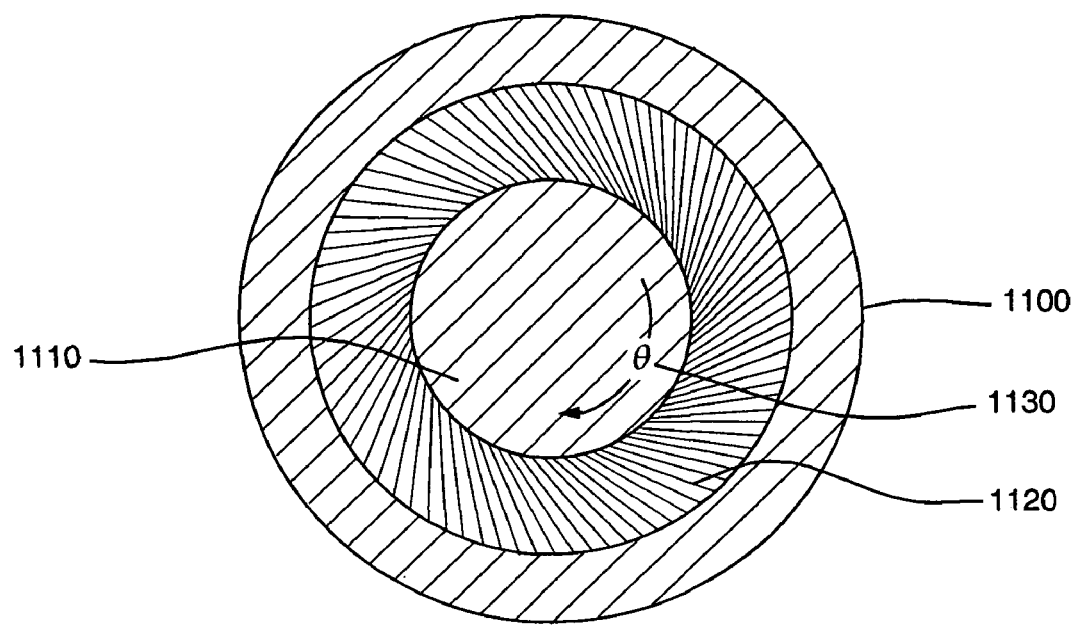
FIGS. 10A and 10B shows use of a film of nanostructures as an interface material during rotary motion between a shaft and a housing.
Figure 10B:
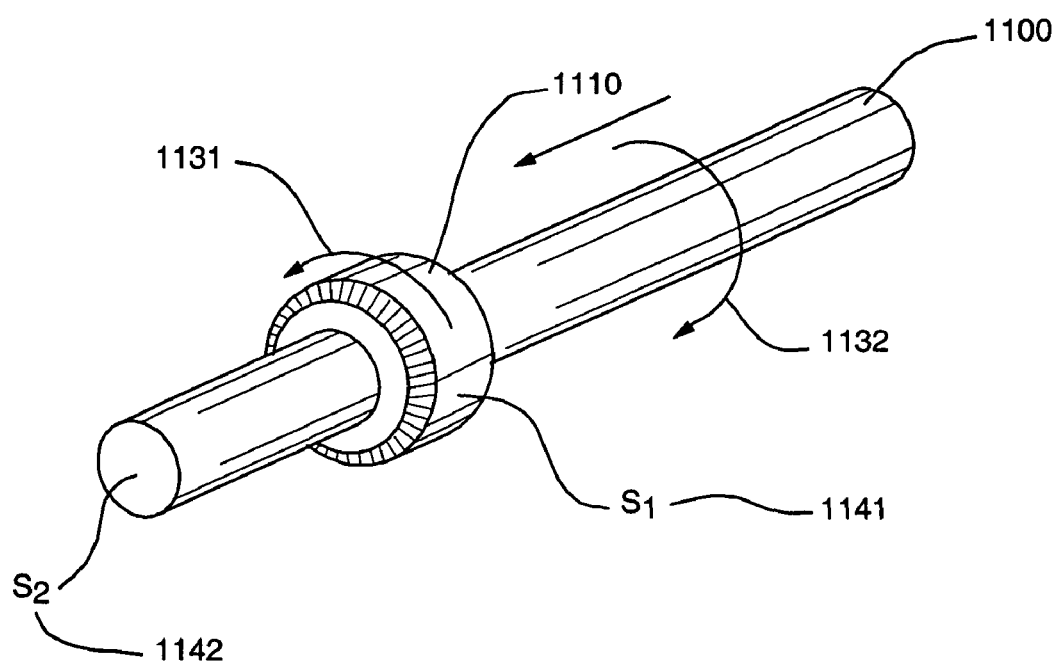
Figure 11A:
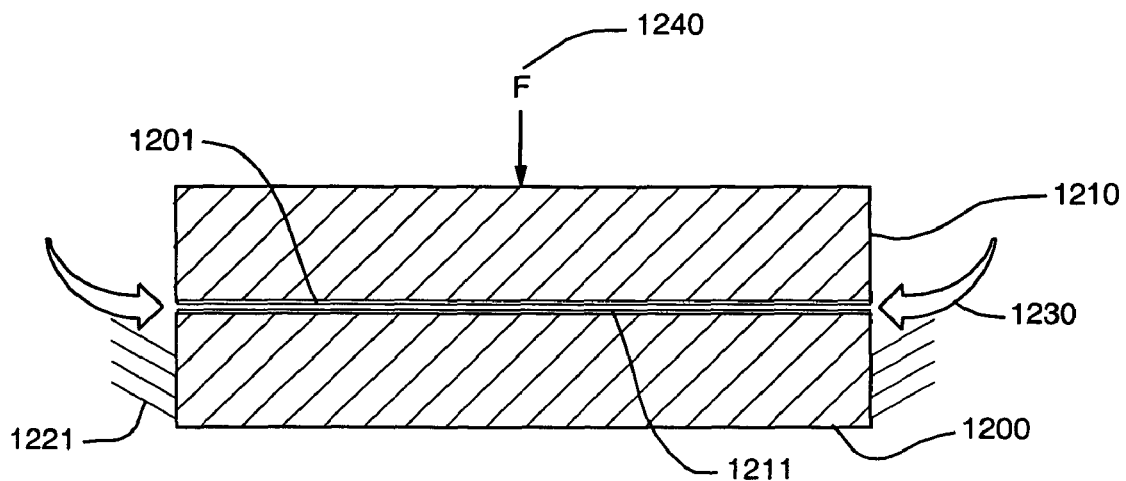
FIGS. 11A-11D shows growth of nanostructures from growth sites on complementary substrates, where the nanostructures form an interpenetrating network.
Figure 11B:
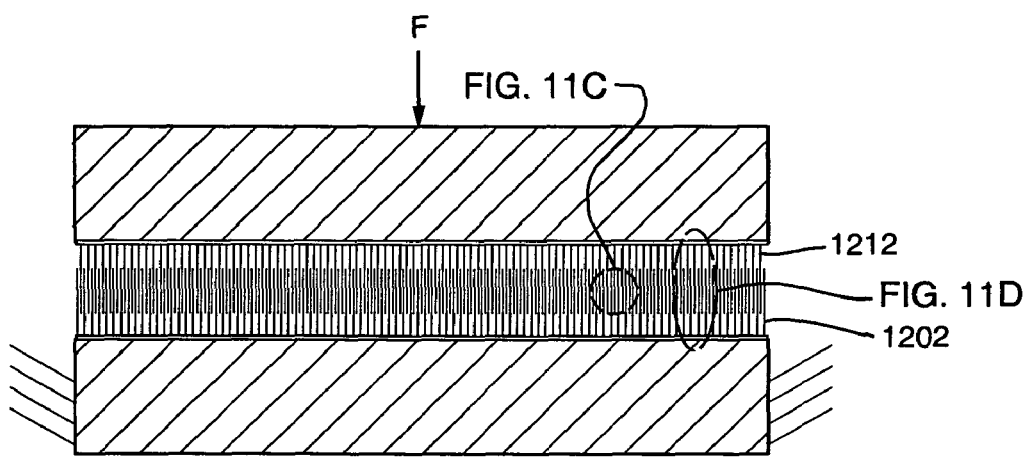
Figures 11C, 11D:
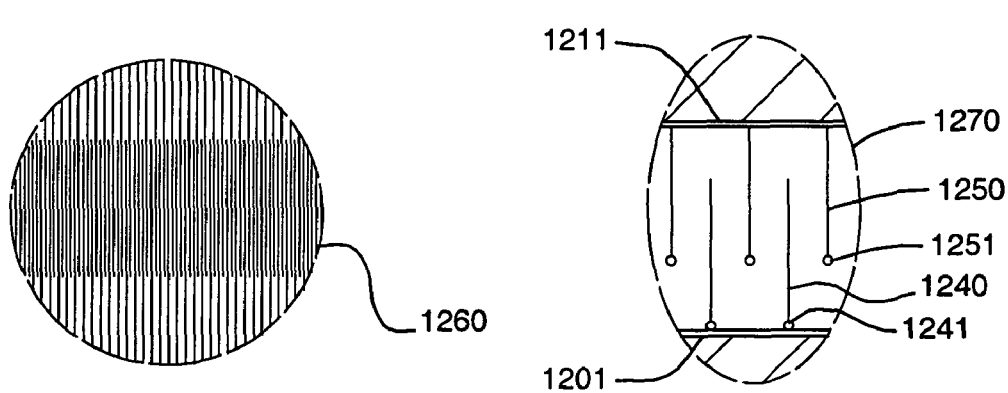

FIGS. 10A and 10B illustrate an exemplary application of an interface of nanostructures, such as a film of aligned carbon nanotubes, as a connection between a shaft and a housing. Here, shaft 1100 and housing 1110 rotate relative to each other as indicated by 1130, 1131, and 1132, and contact between the shaft and the housing is maintained by nanostructures 1120, which have been grown between the shaft and the housing by a method in accordance with the present invention. In this example, the nanostructures adhere to the housing, yet move freely with respect to the shaft, yet maintain contact with the shaft. A substantial advantage of the present invention is that the nanostructures provide an immense number of compliant points of contact with the shaft. For example, CVD growth processes known to those skilled in the art can produce aligned carbon nanotubes with areal density of $10^{10}$-$10^{13}$ carbon nanotubes per $cm^2$. The nanostructures form a transmission pathway between the shaft and the housing, such as for transmission of an electrical signal or for transmission of heat. The signal may be further transmitted by external connections 1141 and 1142 to the housing and the shaft. A translational force may also be incorporated wherein shaft 100 moves within housing 1110 in a generally horizontal direction. More generally, the growth substrate and the cap object may move relative to each other in any translational or rotational direction during growth, while contact is maintained between the substrates, and/or between the substrates and the nanostructures or nanostructured objects.

FIGS. 11A, 11B, 11C, and 11D illustrate growth of nanostructures from a pair of substrates 1200 and 1210, coated with arrangements of growth sites 1201 and 1211. The first substrate is constrained, and a suitable force is applied to the second substrate to cause the nanostructures growing from the substrates to form an interpenetrating network. For example, the nanostructures may grow primarily aligned and perpendicular to the substrates, such as the 1202 from the first substrate and 1212 from the second substrate, and interpenetrate as suggested 1260. The nanostructures growing from the pair of substrates may be of the same type, such as carbon nanotubes, or of different types, such as carbon nanotubes growing from one substrate and silicon nanowires growing from the second substrate. Accordingly, exclusive reactant streams may be delivered to each substrate, or a mixed reactant stream may cause growth of both types of nanostructures, and be selective to the nature (e.g. elemental composition and size) of growth sites arranged on each substrate. A further and similar embodiment is to constrain a first substrate having growth sites against a second substrate having a textured surface or containing holes, pores or microchannels which are open to the first substrate. Application of a suitable force to second substrate, such as by placing a weight on top of the second substrate or using an external actuation mechanism, causes the nanostructures growing from the first substrate to conform to the texture and/or enter the holes, pores, or microchannels in the second substrate. In a particular embodiment, nanostructures grow from one or both substrates by the "base" mode, where the reaction site (e.g., the catalyst particle for growing a carbon nanotube) remains in contact with the respective substrate, or from one or both substrates by the "tip" mode, where the reaction site (e.g., the catalyst particle for growing a carbon nanotube) initially detaches from the respective substrate and moves away from the substrate, advanced by the increasing length of the nanostructure. In the "tip" mode, the nanostructure remains in contact with the substrate. For example, as shown 1270, nanostructure 1240 grows from substrate 1201 by base growth mode, where reaction site 1241 remains attached to the substrate. Nanostructure 1250 is attached to substrate 1211 while growing by tip mode from reaction site 1251. The nanostructures may also grow laterally, such as by direct epitaxial deposition on their sidewalls or by surface diffusion, in addition to by particular growth from a catalyst particle as presented for carbon nanotubes.

Nanostructures can exert a force during growth, and embodiments of the present invention involve using the force exerted by growth of nanostructures to cause assembly of two or more components, or as a method of actuation. The force output by the growth of nanostructures implied by the aforementioned embodiments, where a force, applied through a cap substrate or a template, is used to cause growth of nanostructures to conform to a template. Without the application of a sufficient downward force, used to maintain the position of the cap substrate relative to the growth substrate, the growth of nanostructures lifts the cap substrate.

In all figures, unless otherwise noted on the specific figure or in the accompanying text, it is assumed that the growth substrate is rigidly held in place, although a means of constraining the growth substrate may not be indicated in the figure.

Further, while many embodiments of the present invention are discussed in the context of structures of carbon nanotubes, nanostructures produced in accordance with the present invention may be comprised of a variety of materials. Primarily, nanostructures are elongated nanostructures such as nanotubes, or nanorods, having diameter frequently less than 1 µm, and in the case of carbon nanotubes as small as 10 nm or 1 nm. Examples of nanostructures include carbon nanotubes, including single-walled carbon nanotubes (SWNT), double-walled carbon nanotubes (DWNT), and multi-walled nanotubes (MWNT), and a variety of inorganic materials. The inorganic materials include semiconductor nanowires such as silicon (Si) nanowires, indium-gallium-arsenide (InGaAs) nanowires, and nanotubes comprising boron nitride (BN), silicon nitride ($Si_3N_4$)), silicon carbide (SiC), dichalcogenides such as ($WS_2$), oxides such as titanium dioxide ($TiO_2$) and molybdenum trioxide ($MoO_3$) and boron-carbon-nitrogen compositions such as $BC_2N_2$ ands $BC_4N$.

Further, the nanostructures produced in accordance with the present invention may be subsequently processed with other materials such as a polymer, to reinforce the nanostructured forms and fabricate composite materials using the nanostructures. The nanostructures may also be further processed to affect their density and adhesion properties, such as the density of nanostructures on a substrate or the adhesion between the nanostructures and the substrate surfaces used for growth in accordance with the embodiments of the invention.

The nanostructures produced in accordance with the present invention may be used in a variety of applications, including:

i) Electrical contacts between fixed elements, or fixed and moving elements. For example, an aligned carbon nanotube film may be grown in the gap between concentric rotating elements, to form a brush-like electrical contact between the elements, such as in an electric motor. The shape and texture of the brush can be controlled to control the contact pattern to obtain scrub, for example to break an oxide layer on the opposing contact element.

ii) Thermal transfer elements between fixed elements, or fixed and moving elements. For example, an aligned carbon nanotube film may be placed conformally between a heat-generating component such as a microprocessor, and a heat-dissipating component, such as a fin array. The carbon nanotube array has high thermal conductivity and therefore efficiently dissipates heat from the heat-generating component. The cap used during growth can ensure planarity of the film over a large area, and hence enable increased heat transfer between the components through increased contact area and reduced thermal contact resistance.

iii) As patterned microstructures, where carbon nanotubes or other nanostructures such as silicon nanowires are grown conformally to a template, and used in an application such as a field emitter array, or a scaffold for growth of biological materials, or a filter where the nanostructures are grown to selectively fill fluidic paths such as microchannels in a fluid processing instrument.

An exemplary process for growing carbon nanotubes starts by depositing a catalyst film of 1/10 nm Fe/$Al_2O_3$ e-beam evaporation in a single pump-down cycle using a Temescal VES-2550 with a FDC-8000 Film Deposition Controller. The film thickness is measured during deposition using a quartz crystal monitor, and later confirmed by Rutherford backscattering spectrometry. The substrates are plain (100) 6" silicon wafers (p-type, 1-10 Ω-cm, Silicon Quest International), which have been cleaned using a standard piranha (3:1 $H_2SO_4$:$H_2O_2$) solution. Catalyst patterns are fabricated by lift-off of a 1 µm layer of image-reversal photoresist (AZ-5214E): the photoresist is patterned by photolithography, catalyst is deposited over the entire wafer surface, and then the areas of catalyst on photoresist are removed by soaking in acetone for 5 minutes, with mild sonication.

CNT growth is performed in a single-zone atmospheric pressure quartz tube furnace, having an inside diameter of 22 mm and a 30 cm long heating zone, using flows of Ar (99.999%, Airgas) or He (99.999%, Airgas), $C_2H_4$ (99.5%, Airgas), and H (99.999%, BOC). The furnace temperature is ramped to the setpoint temperature in 10-30 minutes and held for an additional 5-15 minutes. The flows of Ar and $H_2$ used during growth are established 15-45 minutes prior to introducing $C_2H_4$ to appropriately pre-condition (e.g., chemically reduce) the catalyst, then the $C_2H_4$/$H_2$/Ar mixture is maintained for the growth period of 15-60 minutes. Finally, the $H_2$ and $C_2H_4$ flows are discontinued, and Ar is maintained for 10 more minutes to displace the reactant gases from the tube, before being reduced to a trickle while the furnace cools to below 100° C.

In an open configuration (not using a cap substrate or shield substrate), millimeter-tall vertically-aligned CNT (VA-CNT) structures are grown from the Fe/Al$_2$O$_3$ film processed in 100/500/200 sccm C$_2$H$_4$/H$_2$/Ar at 750° C. The CNTs are oriented primarily perpendicular to the substrate and are isolated or are clustered in "bundles" as large as 0.1 μm diameter, in which the CNTs are held closely together by surface forces. HRTEM examination shows that the CNTs are primarily multi-walled and tubular. The CNTs average approximately 8 nm OD and 5 nm ID, and most have 3-7 concentric parallel walls. By SEM examination, metal clusters are routinely observed at the roots of CNTs ripped from the substrate; however, in thorough TEM examination, we did not observe any metal particles along the CNTs. The alignment and density of CNTs appears the same (excluding stress effects discussed later) from the top to bottom of the film walls, suggesting that the structures consist primarily of CNTs extending fully through the thickness. The Raman spectrum of the samples shows a typical signature of MWNTs, having a G-band peak centered near 1582 cm$^{-1}$, a G/D ratio slightly greater than unity, and a "shoulder" peak near 1620 cm$^{-1}$. This is compared to the Raman spectrum of a SWNT film grown from a Mo/Fe/Al$_2$O$_3$ film in CH$_4$/H$_2$, which has a much sharper G-band peak near 1591 cm$^{-1}$ and a much higher G/D ratio. When the catalyst film is patterned, CNT structures having identical cross-sections can be grown in large arrays and complex shapes can be defined. This exemplary CVD process can be combined with the methods of the present invention to produce carbon nanotubes in shape-controlled architectures and as conformal interface materials.

Figure 12:
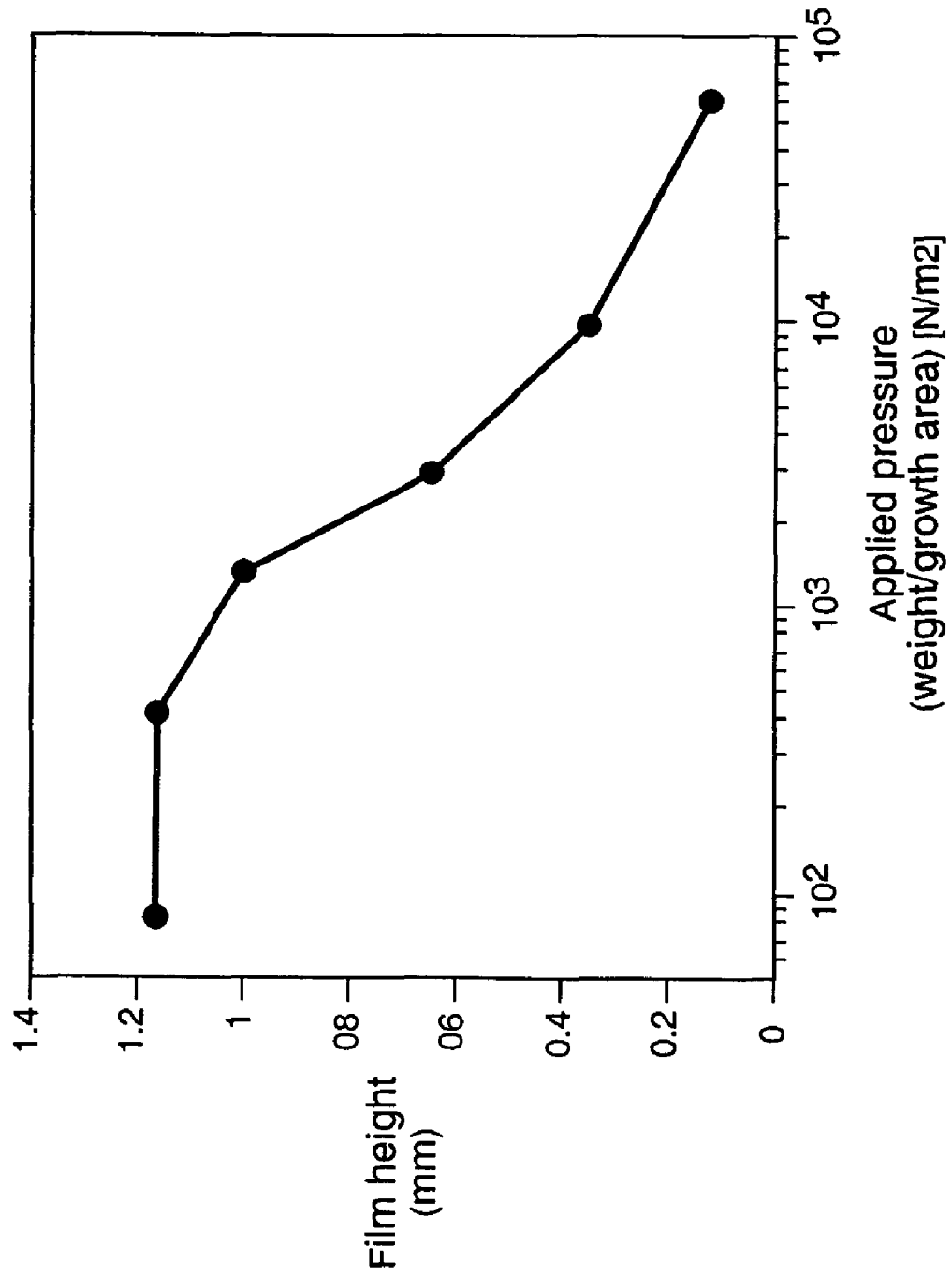
FIG. 12 shows the variation of carbon nanotube film height with mass of weight applied to the cap, and the variation of film height with downward pressure applied during growth.
Figure 13B:
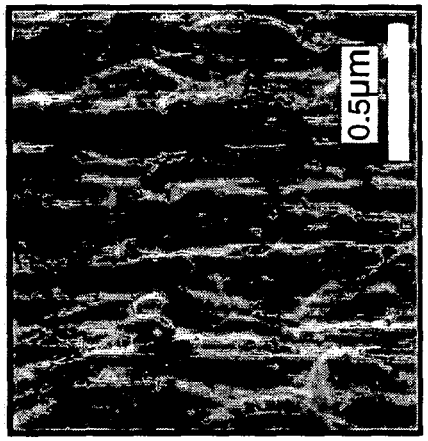
FIGS. 13A-13D shows alignment within carbon nanotube films after growth under different applied mechanical pressures.
Figure 13D:
Figure 13A:
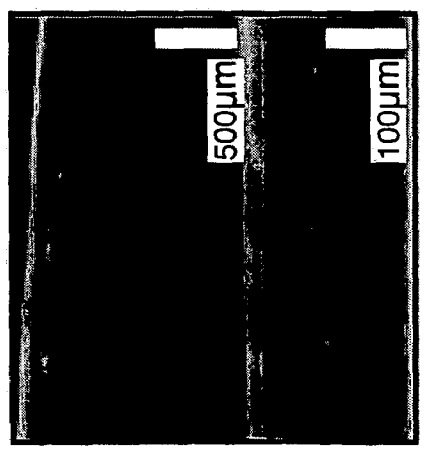
Figure 13C:
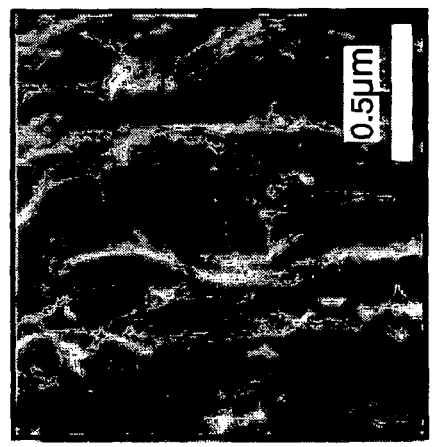

In another example force output by growth of aligned carbon nanotubes is shown. The final thickness and growth rate of a film of carbon nanotubes decreases with increasing pressure placed on top of the substrate, demonstrating that the carbon nanotube growth reaction can exert a force. This is tested in an exemplary laboratory setup by placing a weight on the substrate and measuring the final film thickness. A catalyst-coated silicon substrate is placed on a carrier substrate, which is placed under a cap substrate, which is in turn placed under a weight, such as a block of a high-density material such as tungsten. The assembly is placed in a quartz tube furnace, and carbon nanotube growth is performed as described above. The reactant mixture penetrates the gap between the growth substrate and the cap substrate, and growth of a film of aligned CNTs lifts the cap and weight. An experimentally-observed trend of film thickness and nanotube alignment with increasing applied force are shown in the graphs of FIG. 12 and in the photographs of FIG. 13.

Figure 14:
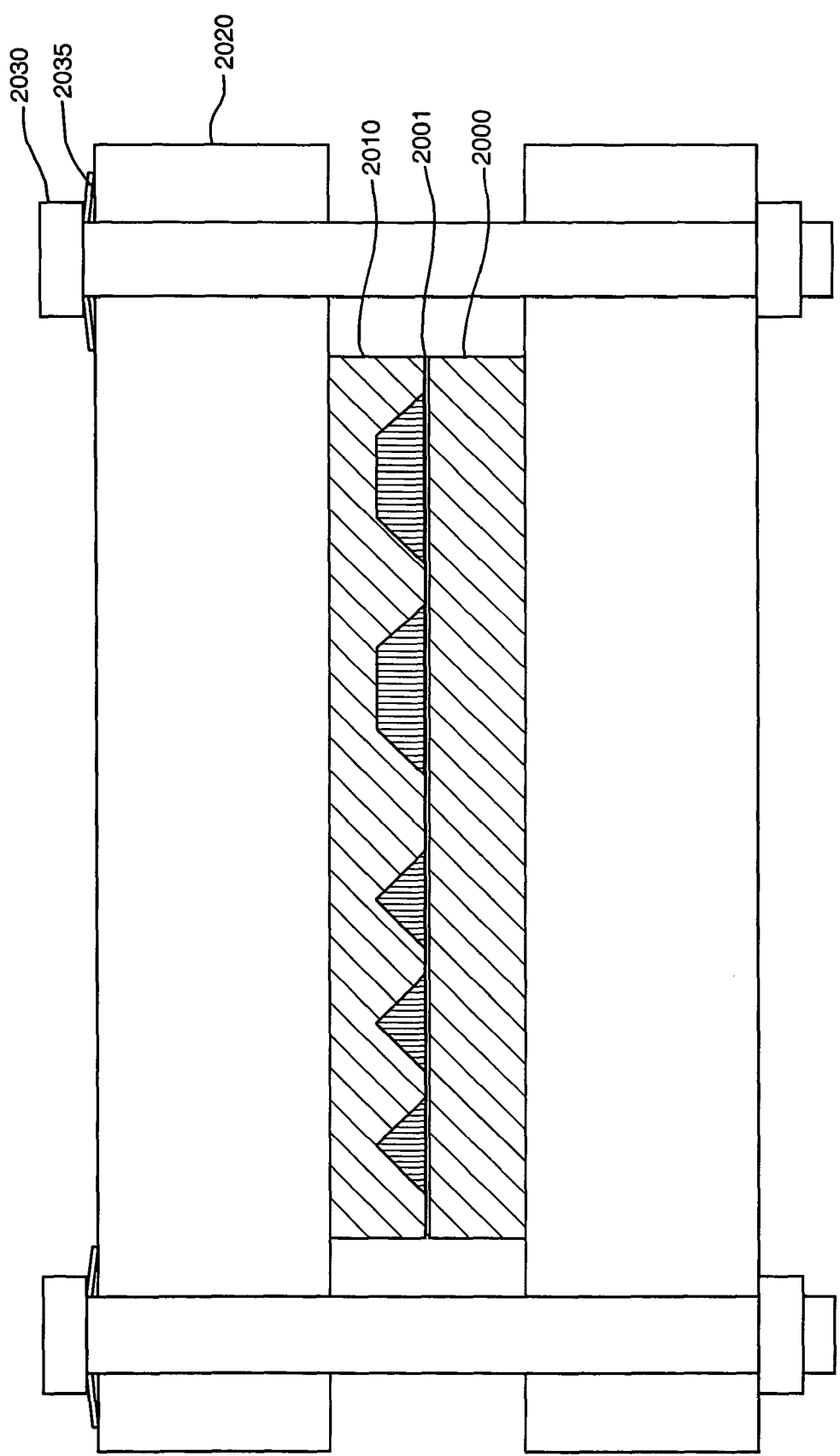
FIG. 14 shows an exemplary setup for producing three-dimensional forms of carbon nanotubes on a substrate, by clamping a microfabricated silicon template against a silicon substrate coated with a catalyst film.
Figure 15B:
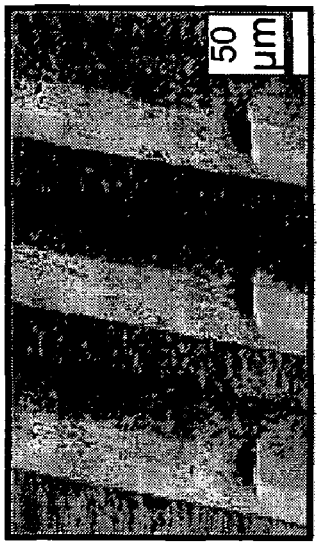
FIGS. 15-15D shows a KOH-etched microchannel template and microstructured forms of carbon nanotubes formed when the template is clamped against the substrate coated with a catalyst film, and the growth of carbon nanotubes is constrained to take the shape of the template.
Figure 15D:
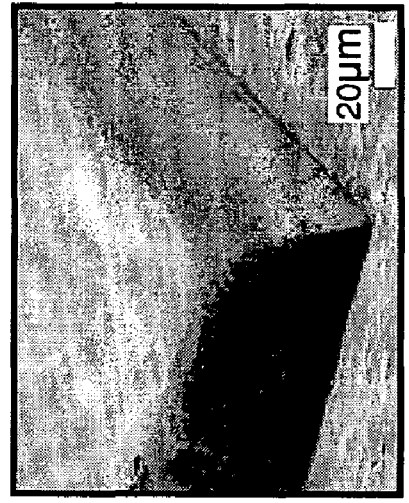
Figure 15A:
Figure 15C:
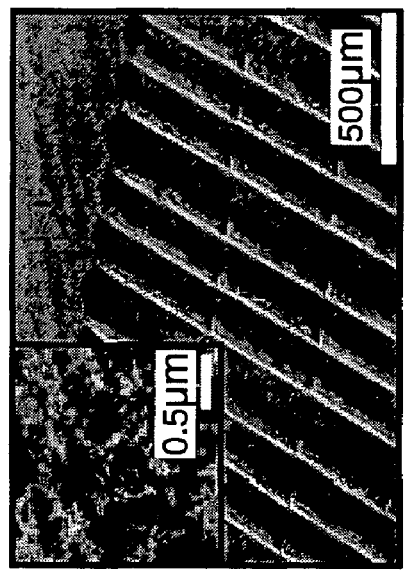
Figure 16A:
FIG. 16 shows the cross-section of a carbon nanotube structure grown to conform to the microfabricated template.
Figure 16C:
Figure 16B:
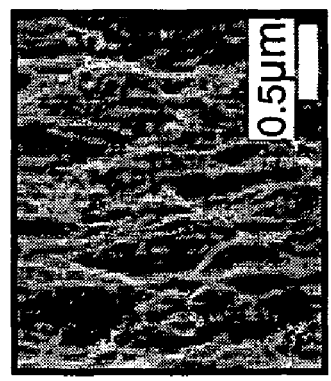
Figure 16D:
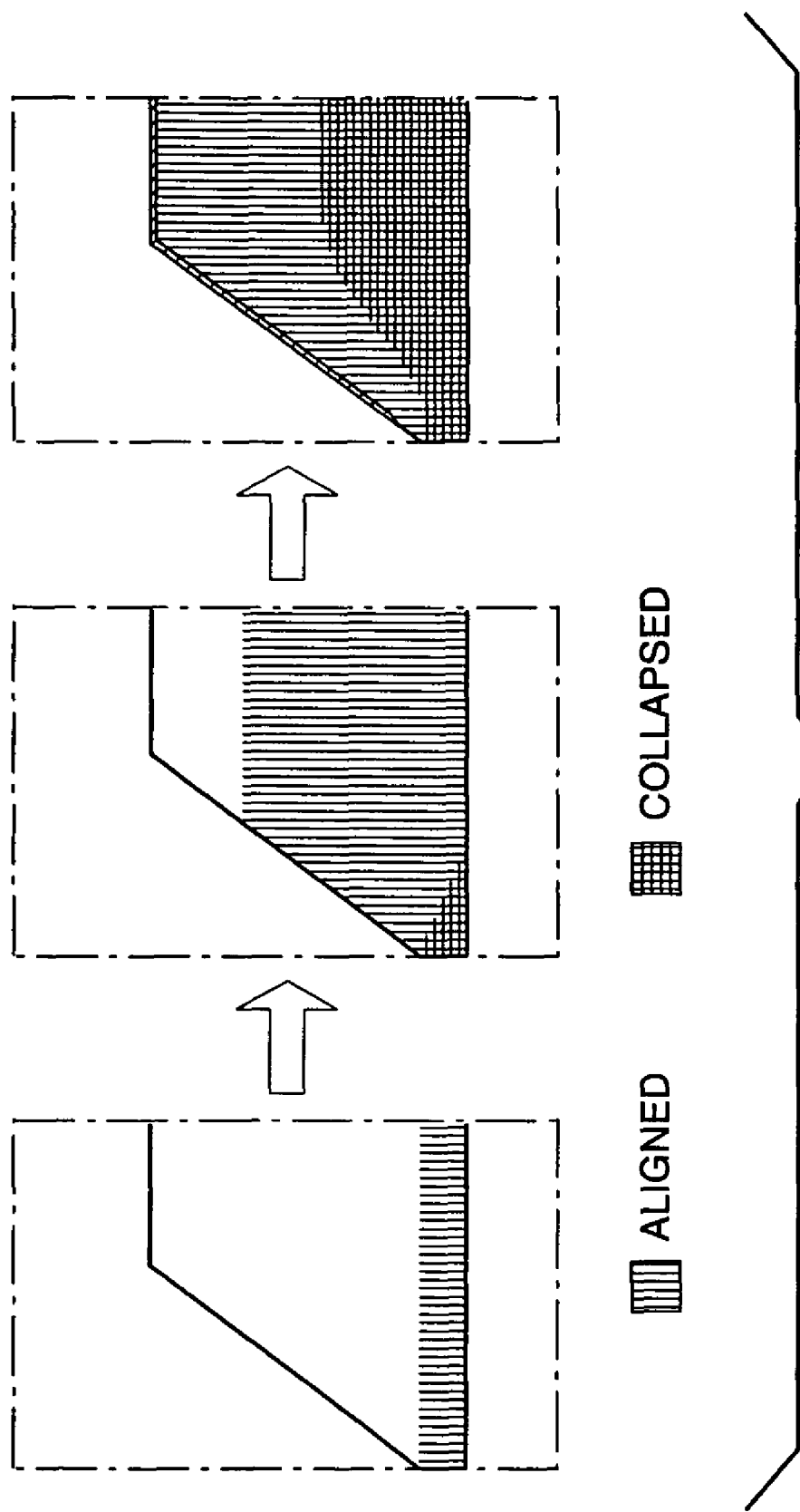

A third example is when a microstructured template is clamped against a growth substrate, carbon nanotubes are grown to fill the cavities between the growth substrate and the template, producing free-standing carbon nanotube microstructures conforming to the shape of the template. FIG. 14 shows an exemplary apparatus for holding a template against the substrate, where a catalyst-coated substrate 2000 is mated with a microstructured template 2010, and placed between quartz plates 2020. The plates are clamped using Al$_2$O$_3$ bolts 2030, and preloaded using Inconel spring washers 2035. The assembly is placed inside a tube furnace, and carbon nanotube growth is conducted. FIG. 15 shows a microchannel template and corresponding carbon nanotube structures grown to conform to the template. FIG. 16 shows the cross-section of a carbon nanotube structure grown to conform to the microfabricated template, along with images and a schematic which show the effect of mechanical pressure on the alignment and geometric arrangement of the carbon nanotubes within the structure.

Figure 17A:
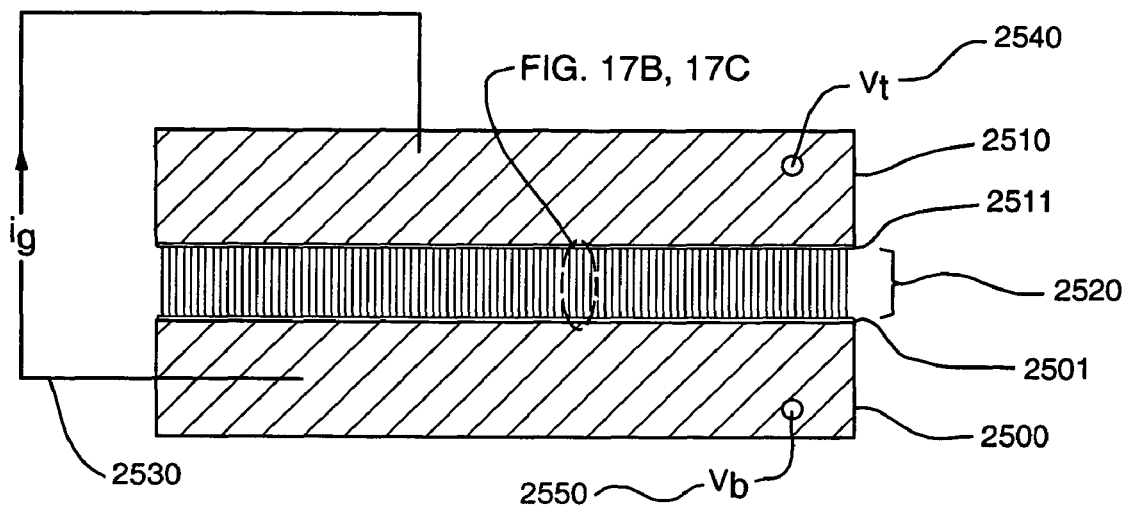
FIG. 17 shows how an electrical current may be passed through the nanostructures during processing.
Figure 17B:
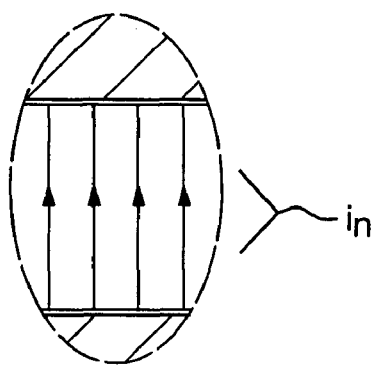
Figure 17C:
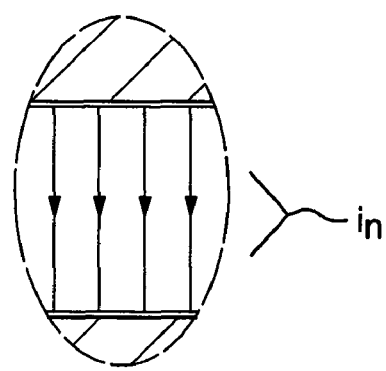
Figure 18A:
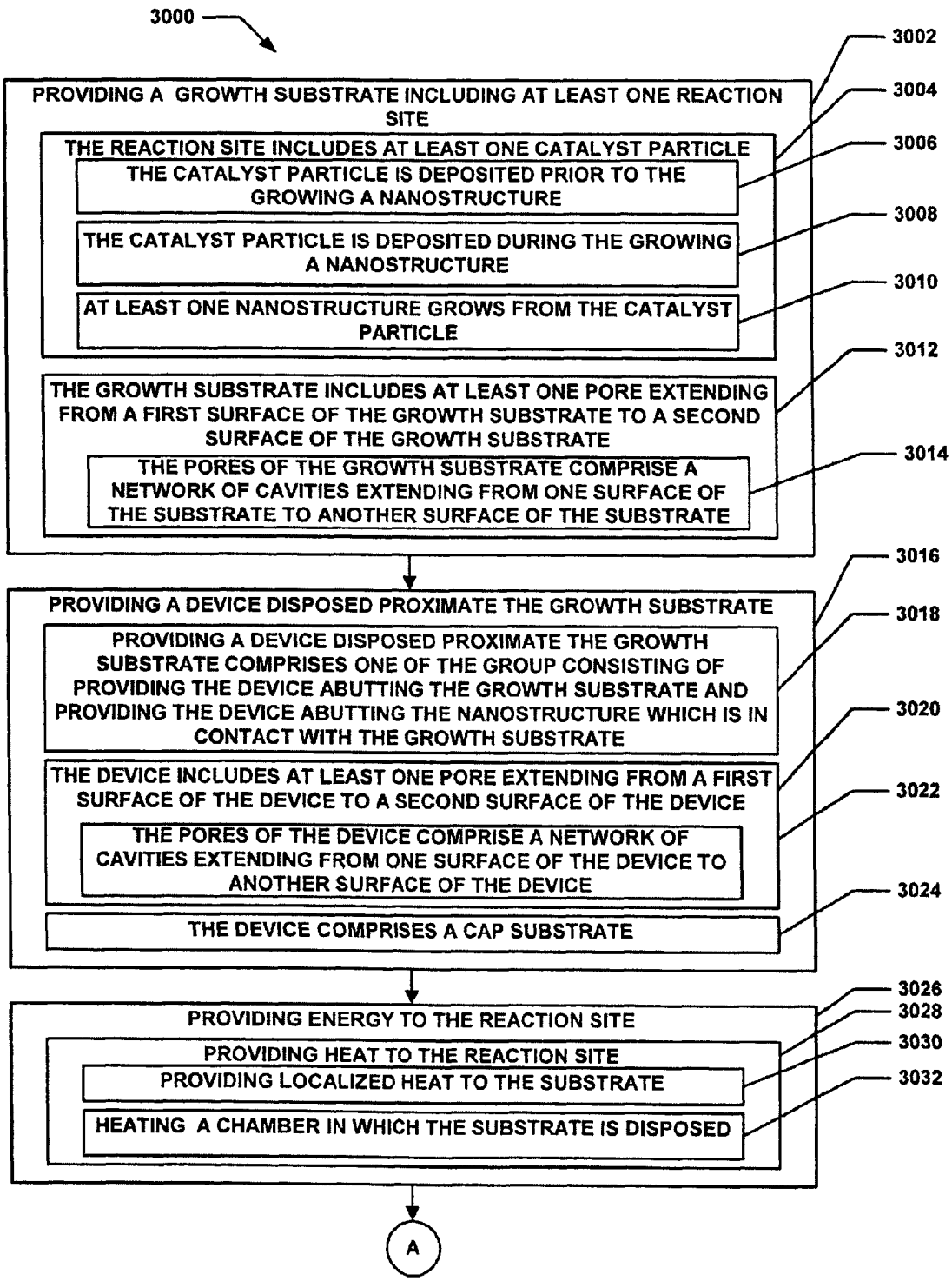
FIGS. 18A-18D depict a flow diagram of a particular method for providing shape-controlled growth of nanostructured films and objects in accordance with the present invention.
Figure 18B:
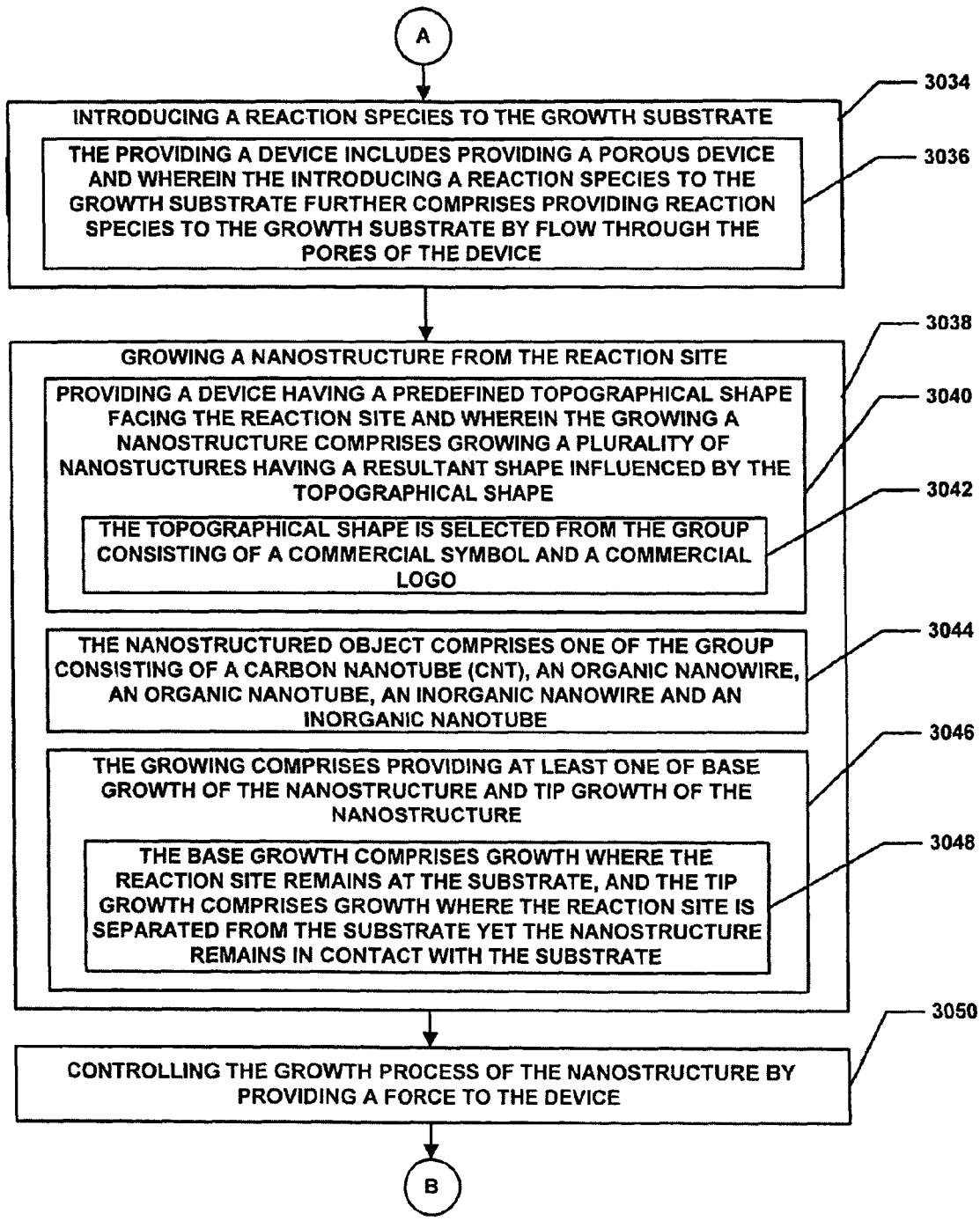
Figure 18C:
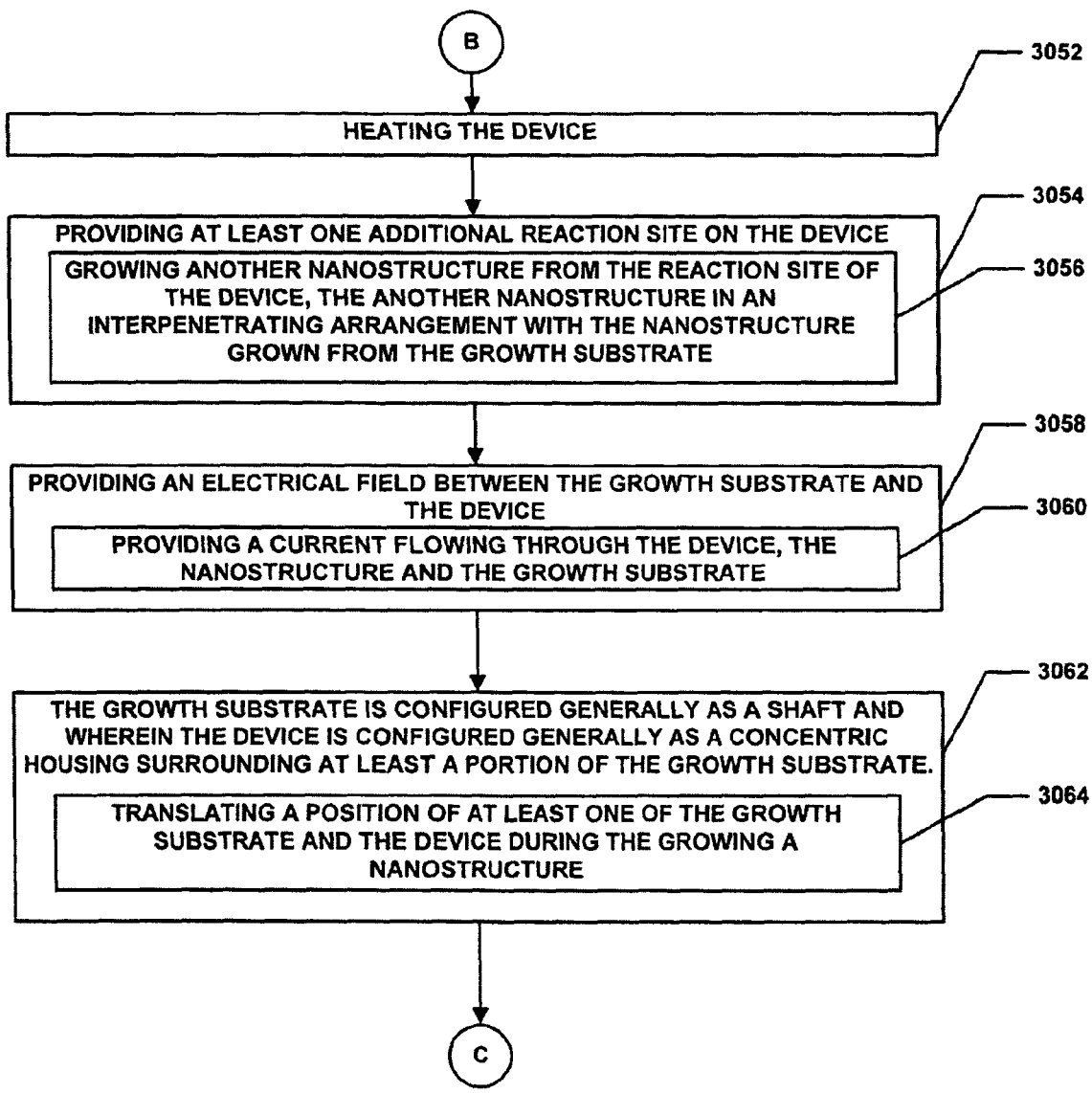
Figure 18D:
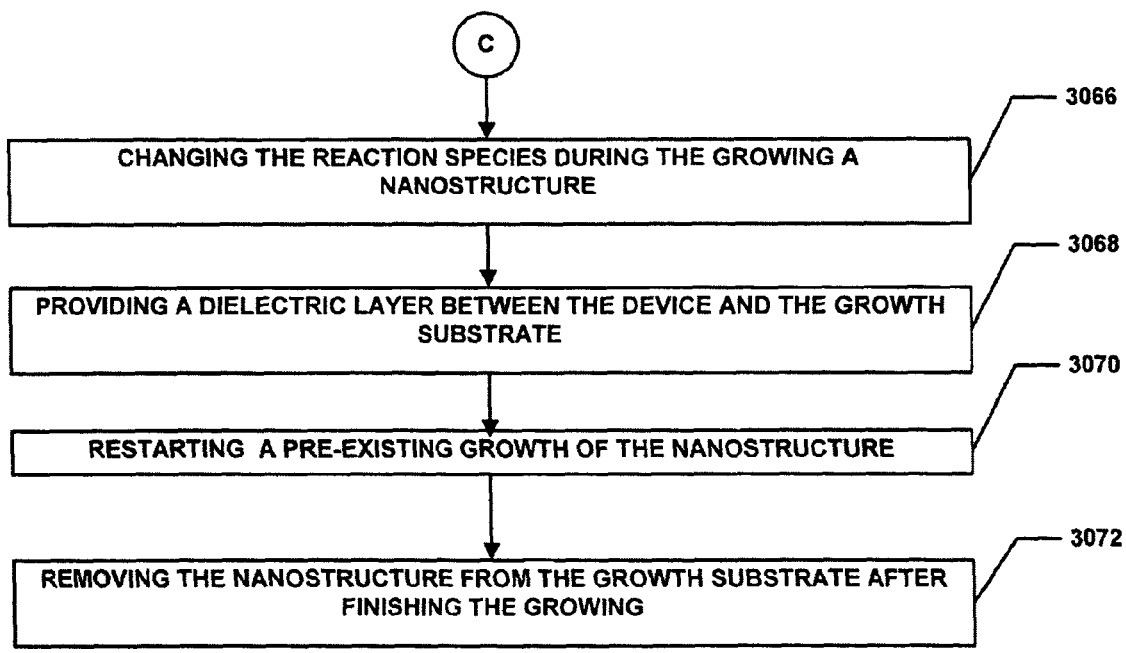

FIG. 17 shows how an electrical current may be passed through the nanostructures during processing in accordance with the present invention. Nanostructures 2520 are grown between substrates 2500 and 2510, and maintain contact with surfaces 2501 and 2511. An electrical current 2530 is passed through the substrates and through the nanostructures between the substrates. This current may travel from the first substrate to the second substrate as in FIG. 17B or in the opposite direction as in FIG. 17C, e.g. in the direction of growth or in the opposite direction of growth. Because the nanostructures are connected to the substrates in a parallel circuit configuration, the total current flowing through the apparatus will be divided among the nanostructures, according to their individual electrical characteristics. Further, current may be passed through the nanostructures and/or through the substrates so as to resistively heat the structures, substrates, and/or growth sites to provide the energy necessary for the reaction. It may be typical to measure the voltage potentials 2540 and 2550 between the substrates In addition to application of a mechanical force to the nanostructures, an electric field may be used to direct the growth of electrically conductive nanostructures to conform to the shape of a template. FIG. 7 illustrates such an exemplary method, where substrate 800, on which growth sites 801 are arranged, is capped by a template 810. The downward-facing surface of the template is coated by an insulating (dielectric) layer 811. The template and the growth substrate are conductive, and an electric field is applied as a voltage 850 between the substrates. The insulating layer prevents the nanostructures from shorting the field between the substrates, when the nanostructures contact the external surfaces of both substrates. Forms of nanostructures, for example 821 and 822, grow to take the shape of the cavities between the substrate, and force 840 is applied to the template.

A flow chart of a particular embodiment of the presently disclosed method is depicted in FIGS. 18A-D. The rectangular elements are herein denoted "processing blocks" and represent computer software instructions or groups of instructions. Alternatively, the processing blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required in accordance with the present invention. It should be noted that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention. Thus, unless otherwise stated the steps described below are unordered meaning that, when possible, the steps can be performed in any convenient or desirable order.

A particular embodiment of a method 3000 of performing shape-controlled growth of nanostructured films and objects is shown. The method begins with processing block 3002 which states providing a growth substrate including at least one reaction site. As further recited in processing block 3004 the reaction site includes at least one catalyst particle. As shown in processing block 3006 the catalyst particle is deposited prior to the growing a nanostructure. As further shown in processing block 3008 the catalyst particle is deposited during the growing a nanostructure. Processing block 3010 discloses that at least one nanostructure is grown from the catalyst particle. Processing block 3012 recites the growth substrate includes at least one pore extending from a first surface of the growth substrate to a second surface of the growth substrate. Processing block 3014 recites that the pores of the growth substrate comprise a network of cavities extending from one surface of the growth substrate to another surface of the growth substrate.

Processing continues with processing block 3016 which states providing a device disposed proximate the growth substrate. As shown in processing block 3018 the device may be in an abutting relationship with the growth substrate or abutting the nanostructure grown from the growth substrate. Processing block 3020 recites the device includes at least one pore extending from a first surface of the device to a second surface of the device. Processing block 3022 recites that the pores of the device comprise a network of cavities extending from one surface of the device to another surface of the device. The device may comprise, as shown in processing block 3024 a cap substrate.

Processing block 3026 discloses providing energy to the reaction site. As shown in processing block 3028 this may include providing heat to the reaction site. As further shown in processing block 3030 providing heat to the reaction site comprises providing localized heat to the substrate. As further shown in processing block 3032 this may comprise heating a chamber in which the substrate is disposed.

Processing block 3034 states introducing a reaction species to the growth substrate. Processing block 3036 states providing a device includes providing a porous device and wherein the introducing a reaction species to the growth substrate further comprises providing reaction species to the growth substrate through the at least one pore of the device.

Processing block 3038 discloses growing a nanostructure from the reaction site. As shown in processing block 3040, this can include providing a device comprises providing a device having a predefined topographical shape facing the reaction site and wherein the growing a nanostructure comprises growing a plurality of nanostuctures having a resultant shape influenced by the topographical shape. Processing block 3042 discloses the topographical shape may be in the form of a commercial symbol or a commercial logo. Processing block 3044 states the nanostructured object comprises one of the group consisting of a carbon nanotube (CNT), an organic nanowire, an organic nanotube, an inorganic nanowire, and an inorganic nanotube. As further stated in processing block 3046, the growing comprises providing at least one of base growth of the nanostructure and tip growth of the nanostructure. Processing block 3048 recites that base growth comprises growth wherein the reaction site remains at the substrate and that tip growth comprises growth where the reaction site is separated from the substrate yet the nanostructure remains in contact with the substrate.

Processing block 3050 discloses controlling the growth process of the nanostructure by providing a force to the device. Processing block 3052 states heating the device.

Processing block 3054 states providing at least one additional reaction site on the device. This may further include, as shown in processing block 3056 growing another nanostructure from the reaction site of the device, the another nanostructure in an interpenetrating arrangement with the nanostructure grown from the growth substrate.

Processing block 3058 recites providing an electrical field between the growth substrate and the device. Processing block 3060 states providing a current flowing through the device, the nanostructure and the growth substrate Processing block 3062 recites wherein the growth substrate is configured generally as a shaft and wherein the device is configured generally as a concentric housing surrounding at least a portion of the growth substrate. As recited in processing block 3064 the growing includes translating at least one of the growth substrate and the device during the growing a nanostructure.

Processing block 3066 discloses changing the reaction species during the growing a nanostructure. Processing block 3068 states providing a dielectric layer between the device and the growth substrate. Processing block 3070 recites restarting a pre-existing growth of the nanostructure and processing block 3072 states removing the nanostructure from the growth substrate after finishing the growing.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims.

What is claimed is:

1. A method of growing nanostructures comprising:
   providing a growth substrate including at least one reaction site;
   providing a device disposed proximate said growth substrate, wherein said device comprises a template cap, wherein said template cap and said growth substrate define a cavity therebetween;
   providing energy to said reaction site;
   introducing a reaction species to said growth substrate;
   growing a nanostructure from said reaction site;
   controlling the growth process of the nanostructure by providing a force to said device; and
   wherein said providing a device comprises providing a device having a predefined topographical shape facing said reaction site and wherein said growing a nanostructure comprises growing a plurality of nanostructures having a resultant shape influenced by said topographical shape and filling said cavity defined by said template cap and said growth substrate.

2. The method of claim 1 wherein said providing a device disposed proximate said growth substrate comprises one of the group consisting of providing said device abutting said growth substrate and providing said device abutting said nanostructure which is in contact with said growth substrate.

3. The method of claim 1 wherein said providing a device includes providing a porous device and wherein said introducing a reaction species to said growth substrate further comprises providing reaction species to said growth substrate by flow through the pores of said device.

4. The method of claim 3 wherein the pores of said device comprise a network of cavities extending from one surface of the device to another surface of the device.

5. The method of claim 1 wherein said device comprises a template cap having a manufactured topography to cause shape-controlled growth of nanostructures from said growth substrate.

6. The method of claim 1 further comprising removing said nanostructure from said growth substrate after finishing said growing.

7. The method of claim 1 further comprising heating said device.

8. The method of claim 1 further comprising providing at least one additional reaction site on said device.

9. The method of claim 1 further comprising providing an electrical field between said growth substrate and said device.

10. The method of claim 1 wherein said growth substrate is configured generally as a shaft and wherein said device is configured generally as a concentric housing surrounding at least a portion of said growth substrate.

11. The method of claim 1 further comprising translating a position of at least one of said growth substrate and said device during said growing a nanostructure.

12. The method of claim 8 further comprising growing another nanostructure from said reaction site of said device, said another nanostructure in an interpenetrating arrangement with said nanostructure grown from said growth substrate.

13. The method of claim 1 wherein said reaction site includes at least one catalyst particle.

14. The method of claim 13 wherein at least one nanostructure grows from said catalyst particle.

15. The method of claim 13 wherein said catalyst particle is deposited prior to said growing a nanostructure.

16. The method of claim 13 wherein said catalyst particle is deposited during said growing a nanostructure.

17. The method of claim 1 wherein said nanostructured object comprises one of the group consisting of a carbon nanotube (CNT), an organic nanowire, an organic nanotube, an inorganic nanowire and an inorganic nanotube.

18. The method of claim 1 wherein said providing energy to said reaction site comprises providing heat to said reaction site.

19. The method of claim 18 wherein said providing heat to said reaction site comprises providing localized heat to said substrate.

20. The method of claim 18 wherein said providing heat to said reaction site comprises heating a chamber in which said substrate is disposed.

21. The method of claim 1 further comprising providing a current flowing through said device, said nanostructure and said growth substrate.

22. The method of claim 1 further comprising changing said reaction species during said growing a nanostructure.

23. The method of claim 1 further comprising providing a dielectric layer between said device and said growth substrate.

24. The method of claim 1 wherein said growing comprises providing at least one of base growth of said nanostructure and tip growth of said nanostructure.

25. The method of claim 24 wherein said base growth comprises growth where the reaction site remains at the substrate, and said tip growth comprises growth where the reaction site is separated from the substrate yet the nanostructure remains in contact with the substrate.

26. The method of claim 1 wherein said growth substrate is porous.

27. The method of claim 26 wherein the pores of said substrate comprises a network of cavities extending from one surface of the device to another surface of the device.

28. The method of claim 1 further comprising restarting a pre-existing growth of said nanostructure.

29. The method of claim 28 wherein said restarting comprises said providing a growth substrate including at least one reaction site further including a pre-existing nanostructure and wherein said growing a nanostructure comprises growing said pre-existing nanostructure.

* * * * *